(12) United States Patent
Aida et al.

(10) Patent No.: US 10,991,513 B2
(45) Date of Patent: Apr. 27, 2021

(54) COMPOSITE ELECTRONIC COMPONENT, COMPOSITE ELECTRONIC COMPONENT PACKAGE, CIRCUIT BOARD, AND METHOD OF PRODUCING A COMPOSITE ELECTRONIC COMPONENT

(71) Applicant: Taiyo Yuden Co., Ltd., Tokyo (JP)

(72) Inventors: Shin Aida, Tokyo (JP); Kenichi Sasaki, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 15/918,315

(22) Filed: Mar. 12, 2018

(65) Prior Publication Data
US 2018/0350525 A1   Dec. 6, 2018

(30) Foreign Application Priority Data

Jun. 6, 2017   (JP) .............................. JP2017-111542

(51) Int. Cl.
*H01G 4/40* (2006.01)
*H01G 4/30* (2006.01)
(Continued)

(52) U.S. Cl.
CPC .............. *H01G 4/40* (2013.01); *H01C 7/003* (2013.01); *H01C 13/02* (2013.01); *H01G 2/065* (2013.01); *H01G 4/248* (2013.01); *H01G 4/30* (2013.01); *H05K 1/111* (2013.01); *H05K 3/3431* (2013.01); *H01C 17/06566* (2013.01);
(Continued)

(58) Field of Classification Search
CPC .. H01G 4/40; H01G 4/30; H01G 4/38; H01G 5/014; H01G 4/248; H01G 4/232; H01C 13/02; H01C 7/003; H05K 1/181

USPC ...................... 361/301.4, 303, 306.1, 306.3, 361/321.1–321.3
See application file for complete search history.

(56) References Cited

U.S. PATENT DOCUMENTS 7,630,208 B2 * 12/2009 Lee ...................... H01G 4/012
361/766
2010/0157505 A1 * 6/2010 Feichtinger .............. H01G 4/30
361/301.4
(Continued)

FOREIGN PATENT DOCUMENTS

JP   2016-195236 A   11/2016
JP   2017-126704 A   7/2017

*Primary Examiner* — Arun Ramaswamy
(74) *Attorney, Agent, or Firm* — Saliwanchik, Lloyd & Eisenschenk

(57) ABSTRACT

A composite electronic component includes: a first electronic component including a ceramic body having a main surface caused to face a circuit board at a time of mounting and first and second end surfaces orthogonal to the main surface, and a first external electrode and a second external electrode respectively provided to the first end surface and the second end surface and respectively extending from the first end surface and the second end surface to the main surface; and a second electronic component including a functional film provided to the main surface, and a first electrode film and a second electrode film provided to both end portions of the functional film separately from the first external electrode and the second external electrode, the second electronic component being configured to fit within a thickness of each of the first external electrode and the second external electrode from the main surface.

8 Claims, 15 Drawing Sheets

(51) Int. Cl.
  *H01G 4/232*  (2006.01)
  *H01G 4/248*  (2006.01)
  *H01C 13/02*  (2006.01)
  *H01C 7/00*  (2006.01)
  *H05K 1/18*  (2006.01)
  *H05K 3/34*  (2006.01)
  *H01G 2/06*  (2006.01)
  *H05K 1/11*  (2006.01)
  *H01C 17/065*  (2006.01)

(52) U.S. Cl.
  CPC ............. *H01G 4/232* (2013.01); *H05K 1/181* (2013.01); *H05K 2201/10015* (2013.01); *H05K 2201/10022* (2013.01); *H05K 2201/10045* (2013.01); *H05K 2201/1053* (2013.01); *H05K 2201/10636* (2013.01)

(56) References Cited

U.S. PATENT DOCUMENTS

| | | | |
|---|---|---|---|
| 2015/0340154 A1* | 11/2015 | Kim | H01G 2/14 174/260 |
| 2016/0049256 A1* | 2/2016 | Kitano | H01G 4/30 361/301.4 |
| 2016/0293335 A1* | 10/2016 | Adachi | H01G 4/40 |

\* cited by examiner

COMPOSITE ELECTRONIC COMPONENT, COMPOSITE ELECTRONIC COMPONENT PACKAGE, CIRCUIT BOARD, AND METHOD OF PRODUCING A COMPOSITE ELECTRONIC COMPONENT

CROSS-REFERENCE TO RELATED APPLICATION

This application claims the benefit under 35 U.S.C. § 119 of Japanese Patent Application No. 2017-111542, filed Jun. 6, 2017, the disclosure of which is herein incorporated by reference in its entirety.

BACKGROUND

The present invention relates to a composite electronic component, a composite electronic component package, a circuit board, and a method of producing a composite electronic component.

There is known a circuit board on which a plurality of integrated circuits (ICs) are mounted and which is capable of achieving various functions. Other than the ICs, various components are also mounted on the circuit board. For example, the circuit board includes a passive element such as a capacitor or a resistive element in the vicinity of each IC so as to improve the quality of a signal transmitted and received between the ICs.

For example, in a small circuit board as used in a wearable device, a small component, an embedded component, and the like are used to improve a mounting density. However, along with recent trends of microminiaturization of the circuit board, it has become more and more difficult to ensure a mount space for mounting necessary components.

As a technique capable of saving a mount space, a composite electronic component that integrates a plurality of electronic components is known. Japanese Patent Application Laid-open No. 2016-195236 (hereinafter, referred to as Patent Document 1) discloses a composite electronic component in which a resistive element is provided on the upper surface of a capacitor element. In this composite electronic component, first and second external electrodes are provided to both the end portions of the capacitor element, and first and second connection electrodes are provided to both the end portions of the resistive element.

In the composite electronic component described in Patent Document 1, the side surfaces of the capacitor element are provided with third and fourth external electrodes for connecting the first and second connection electrodes of the resistive element to the lower surface of the capacitor element. With this configuration, mounting of the composite electronic component is enabled by connecting the four external electrodes to a circuit board on the lower surface of the capacitor element.

SUMMARY

However, in the composite electronic component described in Patent Document 1, it is necessary to provide the third and fourth external electrodes in order to connect the resistive element to the circuit board. This increases a production cost. Further, in the composite electronic component described in Patent Document 1, its height is increased by the height of the resistive element provided to the upper surface of the capacitor element, and thus a wide mount space becomes necessary.

In view of the circumstances as described above, it is desirable to provide a composite electronic component, a composite electronic component package, a circuit board, and a method of producing a composite electronic component, which are capable of saving a mount space and a production cost.

According to an embodiment of the present invention, there is provided a composite electronic component including a first electronic component and a second electronic component.

The first electronic component includes a ceramic body having a main surface that is caused to face a circuit board at a time of mounting and a first end surface and a second end surface that are orthogonal to the main surface, and a first external electrode and a second external electrode that are respectively provided to the first end surface and the second end surface and respectively extend from the first end surface and the second end surface to the main surface.

The second electronic component includes a functional film that is provided to the main surface, and a first electrode film and a second electrode film that are provided to both end portions of the functional film separately from the first external electrode and the second external electrode, the second electronic component being configured to fit within a thickness of each of the first external electrode and the second external electrode from the main surface.

The composite electronic component is mounted to a circuit board with the main surface of the first electronic component being caused to face the circuit board, the second electronic component being disposed on the main surface. In the composite electronic component, the second electronic component is configured to fit within the thickness of each of the first and second external electrodes from the main surface and thus does not hinder the mounting of the composite electronic component to the circuit board.

Further, at the time of mounting of the composite electronic component, not only the first and second external electrodes of the first electronic component but also the first and second electrode films of the second electronic component face the circuit board. As a result, in the composite electronic component, it is unnecessary to provide an additional configuration for connecting the first and second electrode films of the second electronic component to the circuit board. This configuration simplifies the production process of the composite electronic component, and thus a production cost can be saved.

Furthermore, in the composite electronic component, the second electronic component fits within a region between the ceramic body of the first electronic component and the circuit board. Thus, it is unnecessary to separately prepare a mount space for the second electronic component. Therefore, in the composite electronic component, the mount space can be saved.

The first electrode film and the second electrode film may face each other in a direction parallel to the first end surface and the second end surface.

In this configuration, a design in which the first and second external electrodes and the first and second electrode films are disposed so as to be separated from each other can be achieved.

The first electronic component may include a multi-layer ceramic electronic component.

The multi-layer ceramic electronic component may include a multi-layer ceramic capacitor.

The second electronic component may include a resistive element.

The second electronic component may further include an insulating film that covers the functional film.

In this configuration, the functional film of the second electronic component can be protected by the insulating film.

According to another embodiment of the present invention, there is provided a composite electronic component package including a composite electronic component, a housing portion, and a sealing portion.

The composite electronic component includes a first electronic component and a second electronic component.

The first electronic component includes a ceramic body having a first main surface and a second main surface that face each other and a first end surface and a second end surface that are orthogonal to the first main surface and the second main surface, and a first external electrode and a second external electrode that are respectively provided to the first end surface and the second end surface and respectively extend from the first end surface and the second end surface to the first main surface.

The second electronic component includes a functional film that is provided to the first main surface, and a first electrode film and a second electrode film that are provided to both end portions of the functional film separately from the first external electrode and the second external electrode, the second electronic component being configured to fit within a thickness of each of the first external electrode and the second external electrode from the first main surface.

The housing portion includes a plurality of recesses, each of the plurality of recesses including a take-out opening and housing the composite electronic component with the second main surface facing toward the take-out opening.

The sealing portion covers the take-out opening of each of the plurality of recesses.

According to another embodiment of the present invention, there is provided a circuit board including a mount surface, a pair of first wiring lines and a pair of second wiring lines that are provided on the mount surface, and a composite electronic component that is mounted on the mount surface.

The composite electronic component includes a first electronic component and a second electronic component.

The first electronic component includes a ceramic body having a main surface that faces the mount surface and a first end surface and a second end surface that are orthogonal to the main surface, and a first external electrode and a second external electrode that are respectively provided to the first end surface and the second end surface and respectively extend from the first end surface and the second end surface to the main surface.

The second electronic component includes a functional film that is provided to the main surface, and a first electrode film and a second electrode film that are provided to both end portions of the functional film separately from the first external electrode and the second external electrode, the second electronic component being configured to fit within a thickness of each of the first external electrode and the second external electrode from the main surface.

According to another embodiment of the present invention, there is provided a method of producing a composite electronic component, the method including: preparing a ceramic body of a first electronic component; and forming a second electronic component on a main surface of the ceramic body by using various types of pastes.

In this configuration, the second electronic component is formed by using the pastes, so that the second electronic component can fit within the thickness of the external electrodes of the first electronic component.

The forming a second electronic component may include forming an electrode film by using an electrically conductive paste, forming a functional film by using a functional paste, and forming an insulating film by using an insulating paste.

The forming a functional film by using a functional paste may be performed after the forming an electrode film by using an electrically conductive paste, and the forming an insulating film by using an insulating paste may be performed after the forming a functional film by using a functional paste.

The forming a second electronic component may further include trimming the functional film.

According to the present invention, it is possible to provide a composite electronic component, a composite electronic component package, a circuit board, and a method of producing a composite electronic component, which are capable of saving a mount space and a production cost.

These and other objects, features and advantages of the present invention will become more apparent in light of the following detailed description of embodiments thereof, as illustrated in the accompanying drawings.

DETAILED DESCRIPTION OF EMBODIMENTS

Hereinafter, embodiments of the present invention will be described with reference to the drawings.

In the figures, an X axis, a Y axis, and a Z axis orthogonal to one another are shown as appropriate. The X axis, the Y axis, and the Z axis are common in all figures.

1. Composite Electronic Component 1

1.1 Overall Configuration

Figure 1:
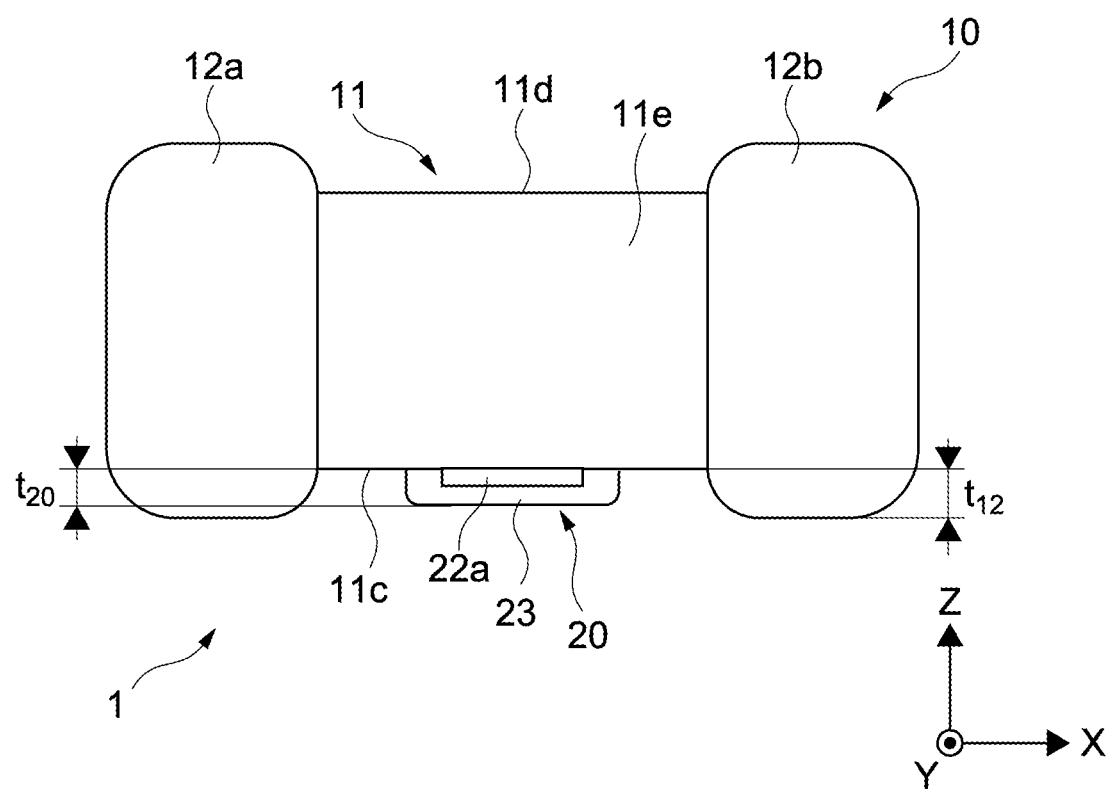
FIG. 1 is a front view of a composite electronic component according to an embodiment of the present invention.
Figure 2:
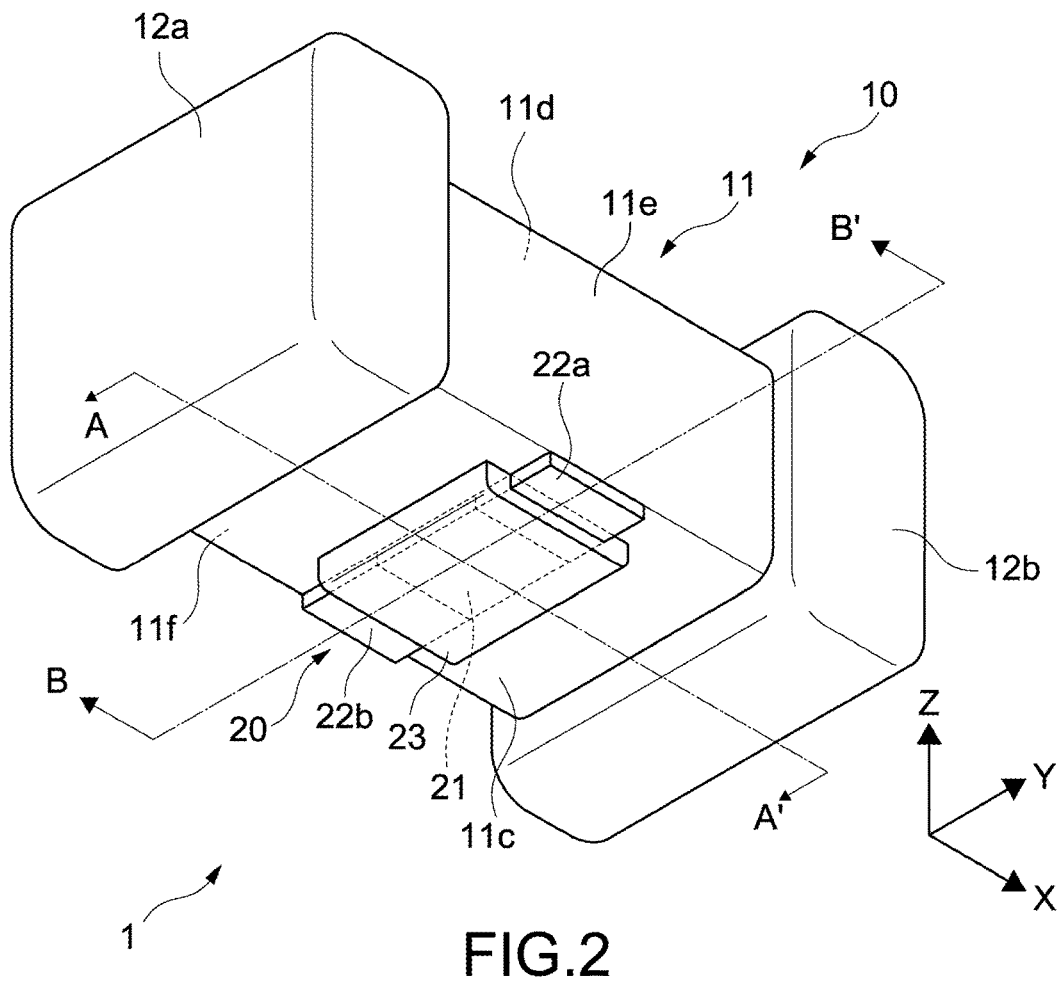
FIG. 2 is a perspective view of the composite electronic component.
Figure 3:
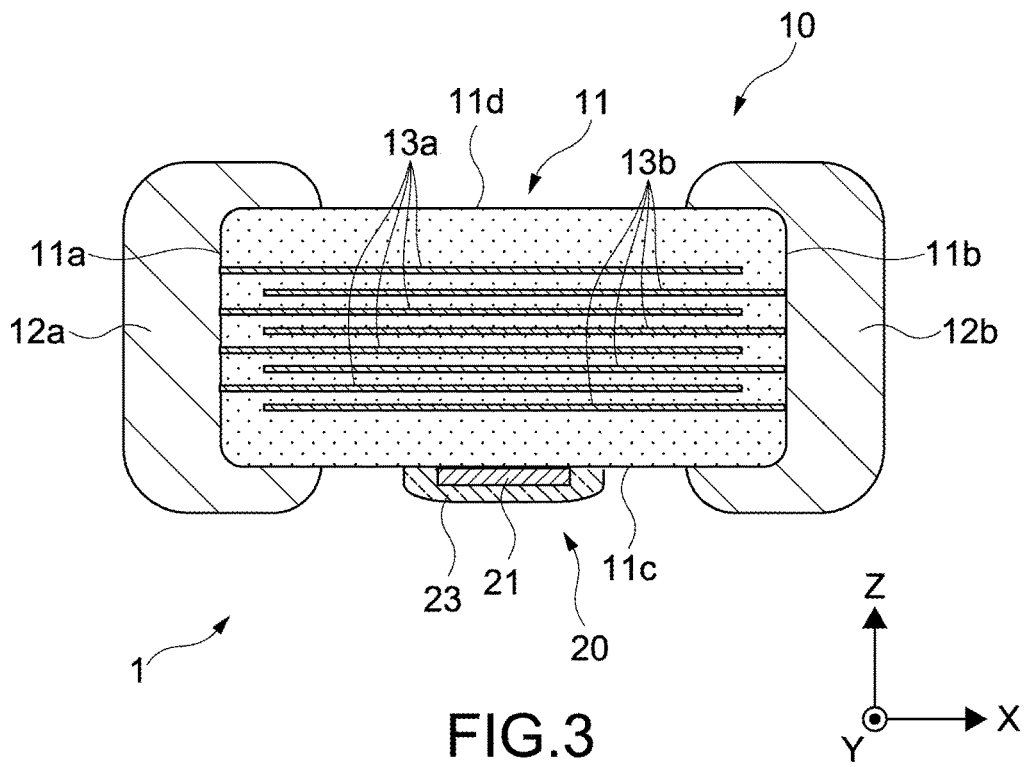
FIG. 3 is a cross-sectional view of the composite electronic component taken along the A-A' line in FIG. 2.
Figure 4:
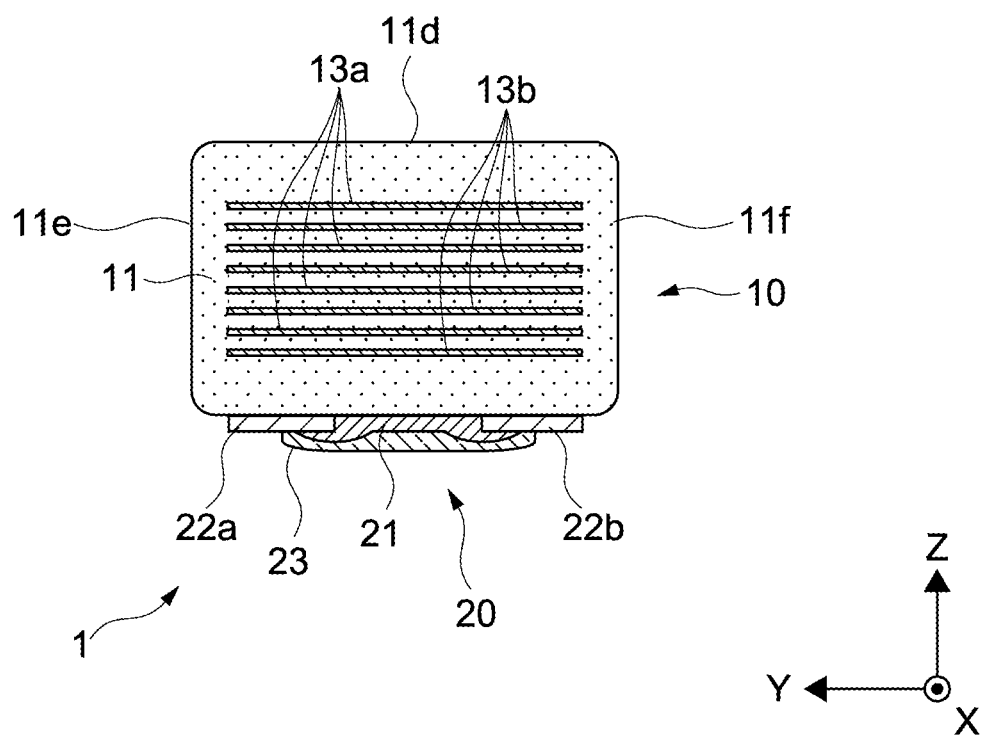
FIG. 4 is a cross-sectional view of the composite electronic component taken along the B-B' line in FIG. 2.

FIGS. 1 to 4 are views of a composite electronic component 1 according to an embodiment of the present invention. FIG. 1 is a front view of the composite electronic component 1. FIG. 2 is a perspective view of the composite electronic component 1. FIG. 3 is a cross-sectional view of the composite electronic component 1 taken along the A-A' line in FIG. 2. FIG. 4 is a cross-sectional view of the composite electronic component 1 taken along the B-B' line in FIG. 2.

The composite electronic component 1 includes two electronic components in combination. Specifically, the composite electronic component 1 includes a multi-layer ceramic capacitor 10 as a first electronic component, and a resistive element 20 as a second electronic component. The resistive element 20 is provided on the lower side of the multi-layer ceramic capacitor 10 in a Z-axis direction.

1.2 Multi-layer Ceramic Capacitor 10

The multi-layer ceramic capacitor 10 includes a ceramic body 11, a first external electrode 12a, and a second external electrode 12b. The ceramic body 11 has a first end surface 11a and a second end surface 11b that are oriented in an X-axis direction, a first main surface 11c and a second main surface 11d that are oriented in the Z-axis direction, and a first side surface 11e and a second side surface 11f that are oriented in a Y-axis direction.

Ridges connecting the respective surfaces of the ceramic body 11 may be chamfered. It should be noted that the shape of the ceramic body 11 is not limited to the shape as shown in FIGS. 1 to 4. For example, the first and second end surfaces 11a and 11b, the first and second main surfaces 11c and 11d, and the first and second side surfaces 11e and 11f of the ceramic body 11 may be curved surfaces. The ceramic body 11 may have a rounded shape as a whole.

The first external electrode 12a and the second external electrode 12b respectively cover both the end surfaces 11a and 11b of the ceramic body 11 that are oriented in the X-axis direction, and extend to the first and second main surfaces 11c and 11d and the first and second side surfaces 11e and 11f that are connected to both the end surfaces 11a and 11b oriented in the X-axis direction. With this configuration, both of the first external electrode 12a and the second external electrode 12b have U-shaped cross sections parallel to an X-Z plane and an X-Y plane.

It should be noted that the first external electrode 12a and the second external electrode 12b only need to extend to the first main surface 11c of the ceramic body 11 and does not need to extend to the second main surface 11d and the first and second side surfaces 11e and 11f of the ceramic body 11. For example, the first external electrode 12a and the second external electrode 12b may extend only to the first main surface 11c of the ceramic body 11 and may have an L-shaped cross section parallel to the X-Z plane.

The first external electrode 12a and the second external electrode 12b are each formed of a good conductor of electricity and function as terminals of the multi-layer ceramic capacitor 10. Examples of the good conductor of electricity forming the first external electrode 12a and the second external electrode 12b include a metal mainly containing nickel (Ni), copper (Cu), palladium (Pd), platinum (Pt), silver (Ag), gold (Au), or the like, and an alloy of those metals.

The first external electrode 12a and the second external electrode 12b are not limited to a specific configuration. For example, the first external electrode 12a and the second external electrode 12b may have a single-layer structure or multi-layer structure. Each of the first external electrode 12a and the second external electrode 12b that has a multi-layer structure may be formed to have a double-layer structure including a base film and a surface film, or a three-layer structure including a base film, an intermediate film, and a surface film, for example.

The ceramic body 11 includes a plurality of first internal electrodes 13a and a plurality of second internal electrodes 13b. The first internal electrodes 13a and the second internal electrodes 13b each have a sheet-like shape extending in parallel with the X-Y plane and are alternately disposed along the Z-axis direction with intervals therebetween. Therefore, the first internal electrodes 13a and the second internal electrodes 13b face each other in the Z-axis direction.

The first internal electrodes 13a are drawn to the first end surface 11a and connected to the first external electrode 12a. The first internal electrodes 13a are separated from the second external electrode 12b. The second internal electrodes 13b are drawn to the second end surface 11b and connected to the second external electrode 12b. The second internal electrodes 13b are separated from the first external electrode 12a.

Typically, the first internal electrodes 13a and the second internal electrodes 13b mainly contain nickel (Ni) and function as internal electrodes of the multi-layer ceramic capacitor 10. It should be noted that the first internal electrodes 13a and the second internal electrodes 13b may mainly contain at least one of copper (Cu), silver (Ag), and palladium (Pd), other than nickel.

The ceramic body 11 is formed of dielectric ceramics. In other words, the first internal electrodes 13a and the second internal electrodes 13b are covered with dielectric ceramics. For the dielectric ceramics, dielectric ceramics having a high dielectric constant is used to increase capacitances of respective layers of the dielectric ceramics (hereinafter, also referred to as dielectric ceramic layers) provided between the first internal electrodes 13a and the second internal electrodes 13b.

Typically, for the dielectric ceramics forming the ceramic body 11, polycrystal of a barium titanate ($BaTiO_3$) based material, i.e., polycrystal having a Perovskite structure containing barium (Ba) and titanium (Ti) is used. This provides the multi-layer ceramic capacitor 10 with a large capacitance.

It should be noted that the dielectric ceramics may be a strontium titanate ($SrTiO_3$) based material, a calcium titanate ($CaTiO_3$) based material, a magnesium titanate ($MgTiO_3$) based material, a calcium zirconate ($CaZrO_3$) based material, a calcium zirconate titanate ($Ca(Zr,Ti)O_3$) based material, a barium zirconate ($BaZrO_3$) based material, a titanium oxide ($TiO_2$) based material, or the like.

With the configuration described above, when a voltage is applied between the first external electrode 12a and the second external electrode 12b in the multi-layer ceramic capacitor 10, the voltage is applied to the dielectric ceramic layers between the first internal electrodes 13a and the second internal electrodes 13b. This allows the multi-layer ceramic capacitor 10 to store charge corresponding to the voltage applied between the first external electrode 12a and the second external electrode 12b.

Any existing design can be freely used for the multi-layer ceramic capacitor 10 according to this embodiment without using a special design for the composite electronic component 1. Therefore, in the composite electronic component 1, the capacitance, the size, or the like of the multi-layer ceramic capacitor 10 can be flexibly selected.

The multi-layer ceramic capacitor 10 is used as a bypass capacitor, for example. The capacitance of the multi-layer ceramic capacitor 10 can be set to, for example, 1 pF to 1 mF. In the multi-layer ceramic capacitor 10, for example, the dimension in the X-axis direction can be set to 1.0 mm, and the dimensions in the Y- and Z-axis directions can be set to 0.5 mm.

1.3 Resistive Element 20

The resistive element 20 includes a resistive film 21, a first electrode film 22a, a second electrode film 22b, and an insulating film 23. The resistive element 20 is provided in the center region of the first main surface 11c of the ceramic body 11 in the X-axis direction. In other words, the resistive element 20 is disposed in a region between the first external electrode 12a and the second external electrode 12b that extend to the first main surface 11c of the ceramic body 11.

The first electrode film 22a and the second electrode film 22b are disposed at both end portions of the first main surface 11c of the ceramic body 11 in the Y-axis direction so as to face each other in the Y-axis direction. The first electrode film 22a and the second electrode film 22b are separated from the first external electrode 12a and the second external electrode 12b. Therefore, the resistive element 20 functions independently of the multi-layer ceramic capacitor 10.

The first electrode film 22a and the second electrode film 22b are each formed of a good conductor of electricity and function as terminals of the resistive element 20. Examples of the good conductor of electricity forming the first electrode film 22a and the second electrode film 22b include a metal mainly containing nickel (Ni), copper (Cu), palladium (Pd), platinum (Pt), silver (Ag), gold (Au), or the like, and an alloy of those metals.

The first electrode film 22a and the second electrode film 22b are not limited to a specific configuration. For example, the first electrode film 22a and the second electrode film 22b may have a single-layer structure or multi-layer structure. Each of the first electrode film 22a and the second electrode film 22b that has a multi-layer structure may be formed to have a double-layer structure including a base film and a surface film, or a three-layer structure including a base film, an intermediate film, and a surface film, for example.

The resistive film 21 is formed of a resistive material and extends in the Y-axis direction between the first electrode film 22a and the second electrode film 22b. Both end portions of the resistive film 21 in the Y-axis direction are superimposed on the first electrode film 22a and the second electrode film 22b and thus connected to the first electrode film 22a and the second electrode film 22b. The resistive film 21 is configured as a functional film that gives a predetermined electric resistance value between the first electrode film 22a and the second electrode film 22b.

The resistive material forming the resistive film 21 is not limited to a specific type and can be selected from well-known resistive materials according to the electric resistance value or the like expected for the resistive element 20. Examples of the resistive material available for formation of the resistive film 21 include lanthanum hexaboride ($LaB_6$) and ruthenium dioxide ($RuO_2$).

In the resistive element 20, if the region where the resistive film 21 and each of the first and second electrode films 22a and 22b are superimposed on each other is small, contact resistance between the resistive film 21 and each of the first and second electrode films 22a and 22b becomes large, with the result that variations in electric resistance value are likely to occur. From this viewpoint, the resistive film 21 is desirably superimposed on each of the first and second electrode films 22a and 22b by the length of 70 μm or more in the Y-axis direction.

The insulating film 23 is provided on the resistive film 21 and covers the entire resistive film 21. The insulating film 23 does not cover the outer portions of the first electrode film 22a and the second electrode film 22b in the Y-axis direction, and thus those outer portions are exposed. With this configuration, when the composite electronic component 1 is mounted on a circuit board C, the first electrode film 22a and the second electrode film 22b can be directly connected to the circuit board C.

The insulating film 23 functions as a protective film that protects the resistive film 21. In other words, the insulating film 23 inhibits the electric resistance value of the resistive film 21 from being changed due to the influence of an external environment such as adhesion of foreign substances to the resistive film 21. Further, the insulating film 23 inhibits the resistive film 21 from being damaged by an external shock or the like.

The insulating film 23 is formed of an insulating material capable of protecting the resistive film 21. The insulating material forming the insulating film 23 is not limited to a specific type and can be selected from well-known insulating materials. Examples of the insulating material available for formation of the insulating film 23 include various glass materials and various resin materials.

The resistive element 20 is formed to be thin in the Z-axis direction so as to fit within the thickness of each of the first and second external electrodes 12a and 12b from the first main surface 11c. In other words, as shown in FIG. 1, the maximum dimension $t_{20}$ of the resistive element 20 from the first main surface 11c in the Z-axis direction is equal to or smaller than the maximum dimension $t_{12}$ of each of the first and second external electrodes 12a and 12b from the first main surface 11c in the Z-axis direction.

It should be noted that the configuration of the resistive element 20 is not limited to that described above and can be variously modified. For example, the resistive film 21 does not need to be superimposed on the first and second electrode films 22a and 22b, and the first and second electrode films 22a and 22b may be superimposed on the resistive film 21. Further, if there is no need to protect the resistive film 21, the insulating film 23 does not need to be provided.

Furthermore, in the arrangement of the resistive element 20 on the first main surface 11c of the ceramic body 11, the first electrode film 22a and the second electrode film 22b only need to be separated from the first external electrode 12a and the second external electrode 12b, and the arrangement thereof may be different from that described above. For example, the first electrode film 22a and the second electrode film 22b may be disposed to face each other in the X-axis direction, and the resistive film 21 may extend in the X-axis direction.

1.4 Equivalent Circuits

Figure 5A:
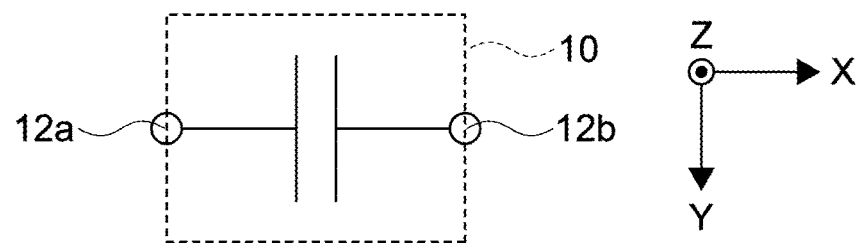
FIGS. 5A, 5B, and 5C are diagrams each showing an equivalent circuit of the composite electronic component.
Figure 5B:
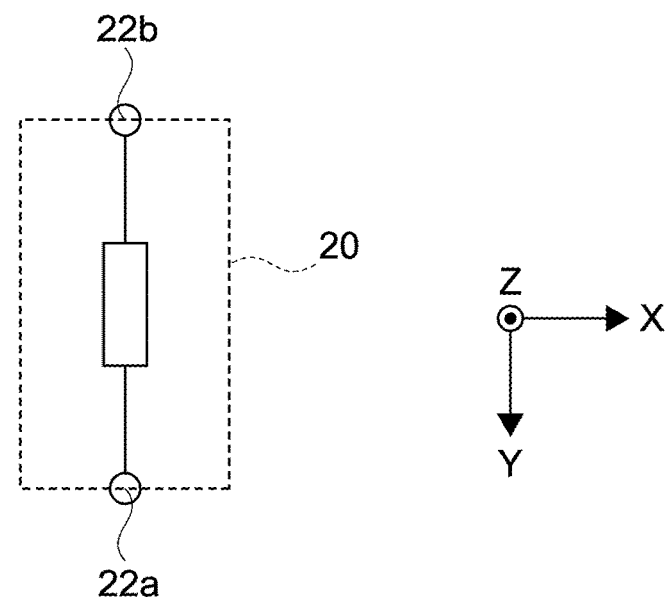
Figure 5C:
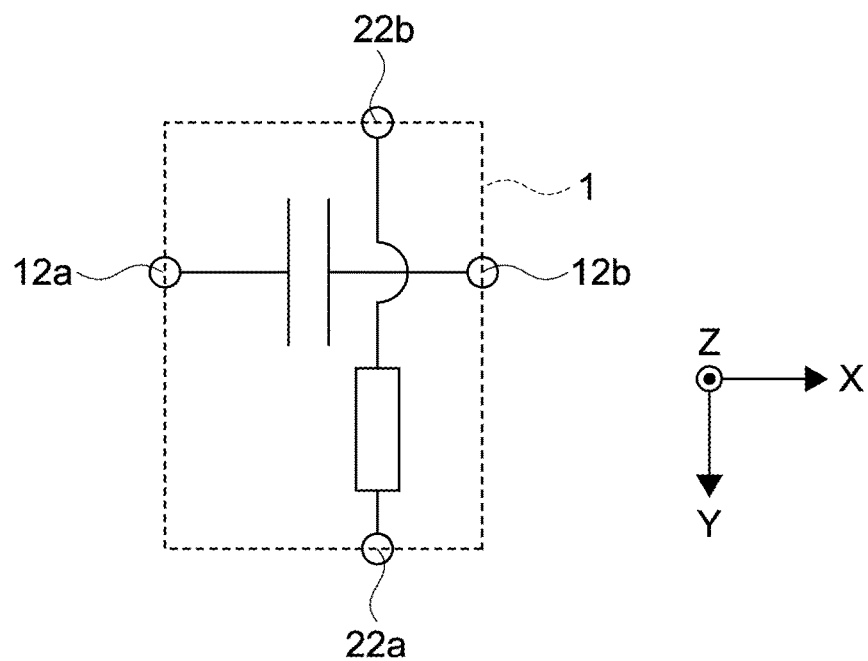

FIG. 5A shows an equivalent circuit of the multi-layer ceramic capacitor 10. FIG. 5B shows an equivalent circuit of the resistive element 20. FIG. 5C shows an equivalent circuit of the composite electronic component 1. As shown in FIGS. 5A to 5C, the composite electronic component 1 has a circuit configuration in which the multi-layer ceramic capacitor 10 and the resistive element 20 are used in combination.

Further, in the composite electronic component 1, the first external electrode 12a and the second external electrode 12b, which are the terminals of the multi-layer ceramic capacitor 10, are insulated from the first electrode film 22a and the second electrode film 22b, which are the terminals of the resistive element 20. With this configuration, in the composite electronic component 1, the function of the multi-layer ceramic capacitor 10 and that of the resistive element 20 can be independently obtained.

It should be noted that the first external electrode 12a and the second external electrode 12b of the multi-layer ceramic capacitor 10 can be connected to the first electrode film 22a and the second electrode film 22b of the resistive element 20 as appropriate through wiring or the like on the mount surface of the circuit board C, so that the multi-layer ceramic capacitor 10 and the resistive element 20 can be series-connected or parallel-connected to each other.

2. Method of Producing Composite Electronic Component 1

Figure 6:
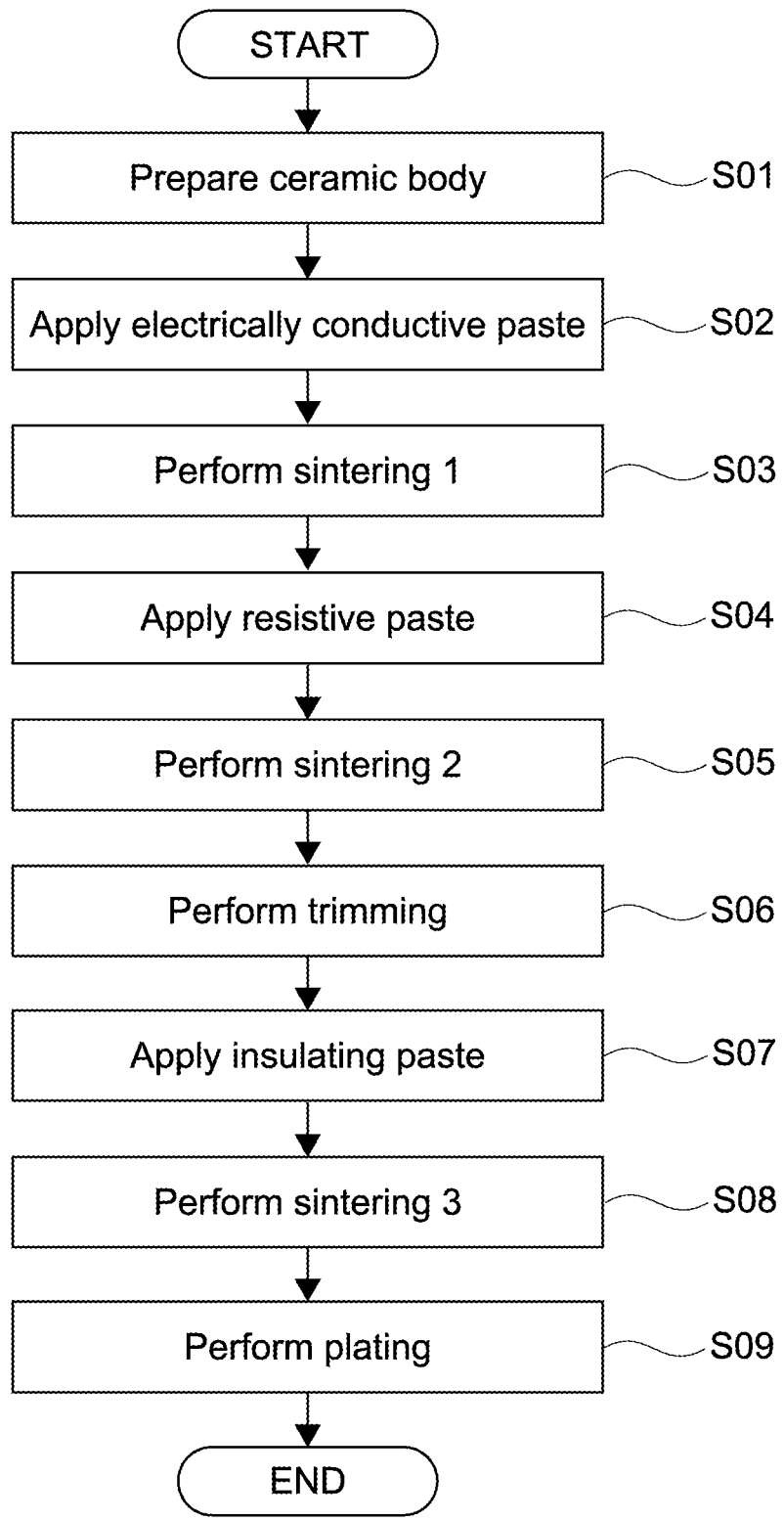
FIG. 6 is a flowchart showing a method of producing the composite electronic component.

FIG. 6 is a flowchart showing a method of producing the composite electronic component 1. FIGS. 7 to 16 are views each showing the production process of the composite electronic component 1. Hereinafter, the method of producing the composite electronic component 1 will be described as appropriate along FIG. 6 with reference to FIGS. 7 to 16.

2.1 Step S01: Preparation of Ceramic Body 11

Figure 7:
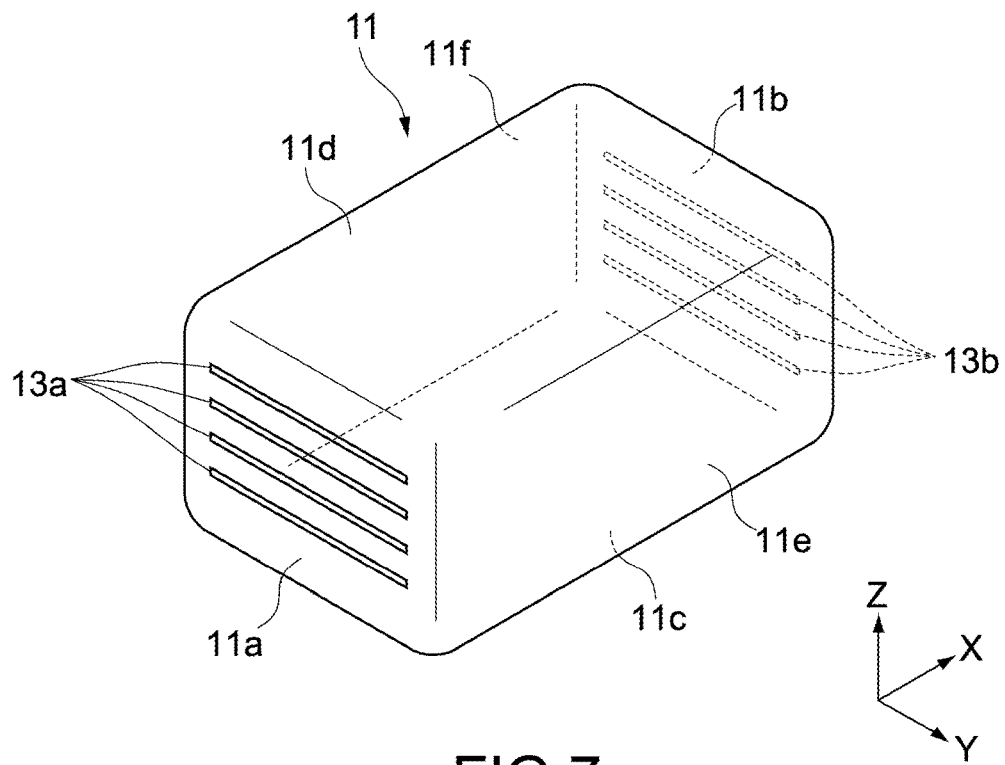
FIG. 7 is a perspective view showing the production process of the composite electronic component.

In Step S01, the ceramic body 11 shown in FIG. 7 is prepared. In the ceramic body 11 shown in FIG. 7, the first and second external electrodes 12a and 12b and the resistive element 20, which are shown in FIGS. 1 to 4, are not provided. In the ceramic body 11, the first internal electrodes 13a and the second internal electrodes 13b are respectively exposed to the first end surface 11a and the second end surface 11b.

2.2 Step S02: Application of Electrically Conductive Paste

Figure 8:
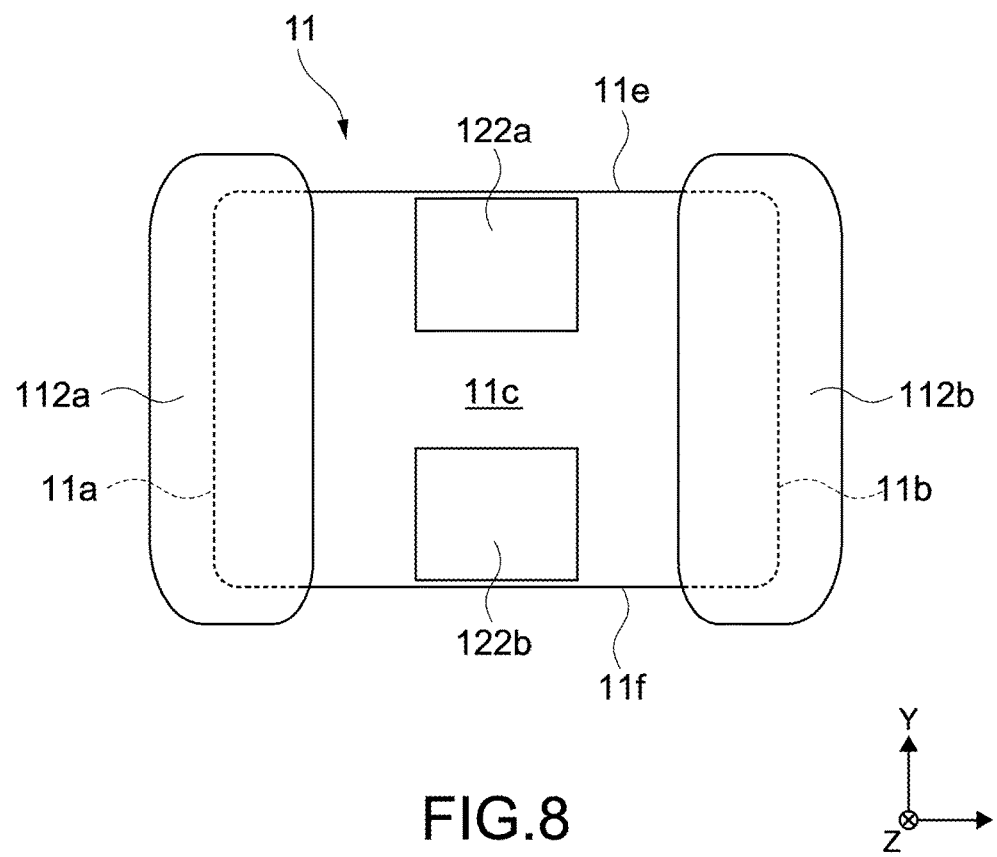
FIG. 8 is a plan view showing the production process of the composite electronic component.

In Step S02, an electrically conductive paste is applied to regions of the ceramic body 11, in which the first and second external electrodes 12a and 12b and the first and second electrode films 22a and 22b are to be formed. Thus, as shown in FIG. 8, unsintered base films 112a and 112b of the respective first and second external electrodes 12a and 12b and unsintered base films 122a and 122b of the respective first and second electrode films 22a and 22b are formed.

For the electrically conductive paste, for example, a metal paste mainly containing nickel (Ni), copper (Cu), palladium (Pd), platinum (Pt), silver (Ag), gold (Au), or the like can be used. Further, different electrically conductive pastes may be used for the base films 112a and 112b and the base films 122a and 122b.

For the application of the electrically conductive paste, for example, various printing methods such as screen printing and gravure printing can be used. Thus, the electrically conductive paste can be applied to an accurate position of the ceramic body 11. Further, for the application of the electrically conductive paste, for example, dipping, spraying, or the like can be used other than printing.

2.3 Step S03: Sintering 1

In Step S03, the electrically conductive paste applied to the ceramic body 11 in Step S02 is sintered. Thus, the sintered base films 112a and 112b of the respective first and second external electrodes 12a and 12b and the sintered base films 122a and 122b of the respective first and second electrode films 22a and 22b are formed at the positions of the ceramic body 11, which are shown in FIG. 8.

In Step S03, for example, a sintering temperature can be set to 900° C., and a sintering time can be set to 15 minutes. Further, in order to inhibit oxidation of the metal material forming the electrically conductive paste, it is desirable to perform Step S03 under a reduction atmosphere or a low-oxygen partial pressure atmosphere at the oxygen partial pressure of 10 ppm or less.

It should be noted that in Step S01 an unsintered ceramic body 11 may be prepared. In this case, in Step S03, the ceramic body 11, the base films 112a and 112b of the respective first and second external electrodes 12a and 12b, and the base films 122a and 122b of the respective first and second electrode films 22a and 22b can be simultaneously sintered.

2.4 Step S04: Application of Resistive Paste

Figure 9:
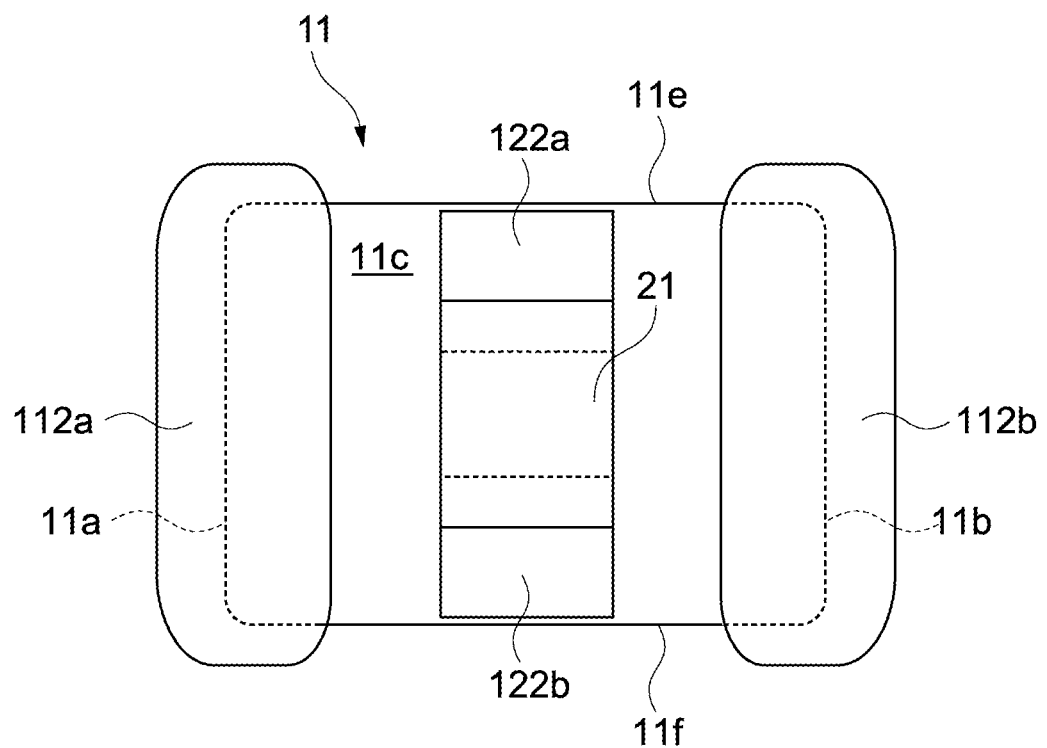
FIG. 9 is a plan view showing the production process of the composite electronic component.
Figure 9:
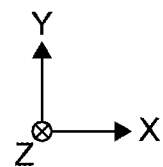

In Step S04, a resistive paste is applied to the first main surface 11c of the ceramic body 11, on which the base films 112a and 112b and the base films 122a and 122b, which are obtained in Step S03, are formed. Thus, as shown in FIG. 9, an unsintered resistive film 21 is formed so as to connect the base films 122a and 122b.

The resistive paste is formed as a functional paste for forming the resistive film 21. In Step S04, for example, a lanthanum hexaboride ($LaB_6$) paste can be used for the resistive paste. For the application of the resistive paste, for example, various printing methods such as screen printing and gravure printing can be used.

2.5 Step S05: Sintering 2

In Step S05, the unsintered resistive film 21 formed on the ceramic body 11 in Step S04 is sintered. Lanthanum hexaboride ($LaB_6$) has a lower sintering temperature than the electrically conductive paste. In Step S05, for example, the sintering temperature can be set to 850° C. It should be noted that the sintering time can be determined as appropriate.

The sintering temperature in Step S05 is made lower than the sintering temperature in Step S03, so that the base films 112a and 112b and the base films 122a and 122b can be inhibited from being degraded in Step S05. Further, in order to inhibit oxidation of the base films 112a and 112b and the base films 122a and 122b, it is desirable to perform Step S05 under a reduction atmosphere or a low-oxygen partial pressure atmosphere at the oxygen partial pressure of 10 ppm or less.

2.6 Step S06: Trimming

Figure 10:
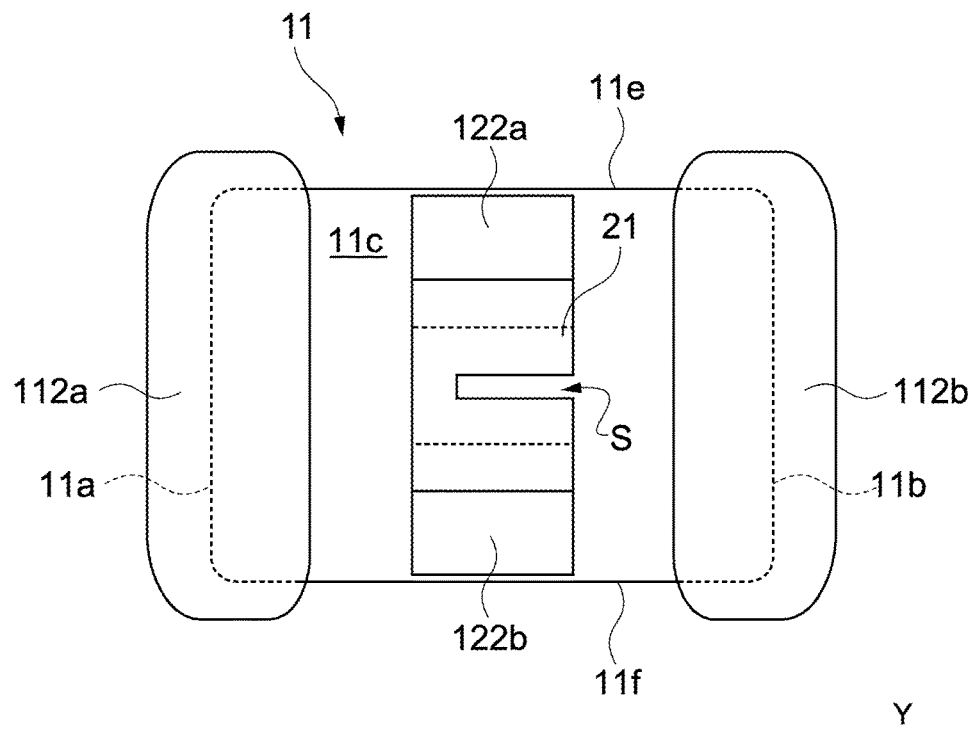
FIG. 10 is a plan view showing the production process of the composite electronic component.

In Step S06, the resistive film 21 sintered in Step S05 is trimmed. More specifically, in Step S06, as shown in FIG. 10, the center portion of the resistive film 21 in the Y-axis direction is removed by laser irradiation, to form a slit S extending in the X-axis direction. This enables the electric resistance value of the resistive film 21 to be set to a designed value with high accuracy.

Further, even if the resistive film 21 has structural variations in dimension, position, or the like, the formation of the slit S can inhibit the occurrence of the variations in initial value of the electric resistance value of the resistive element 20. Changing an overlap area of the resistive film 21 and each of the base films 122a and 122b allows the initial value of the electric resistance value of the resistive element 20 to be adjusted.

Figure 11:
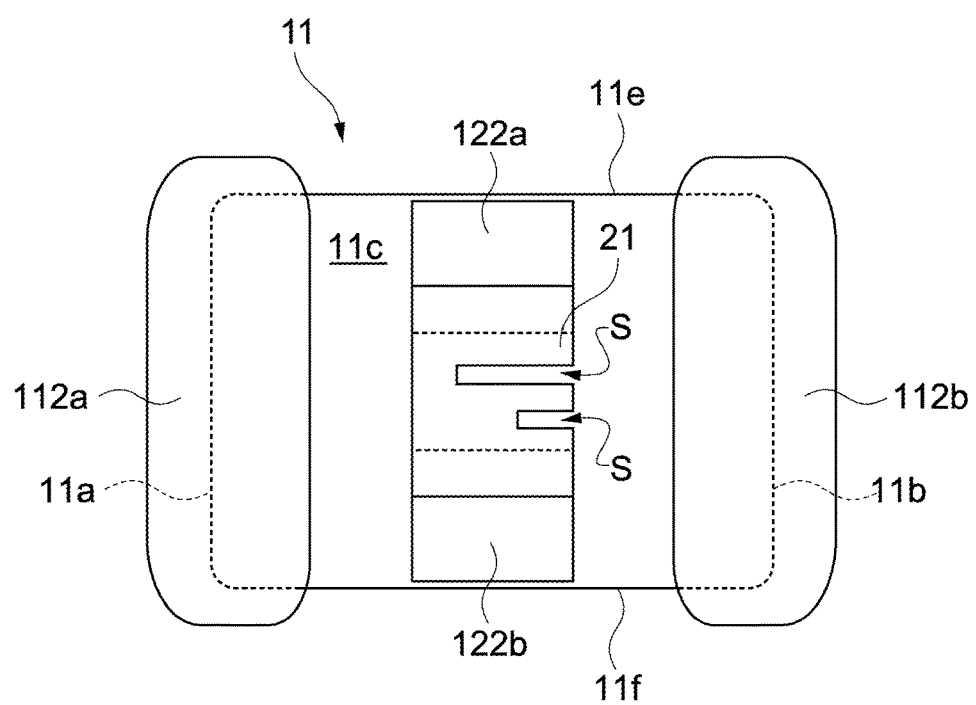
FIG. 11 is a plan view showing the production process of the composite electronic component.
Figure 12:
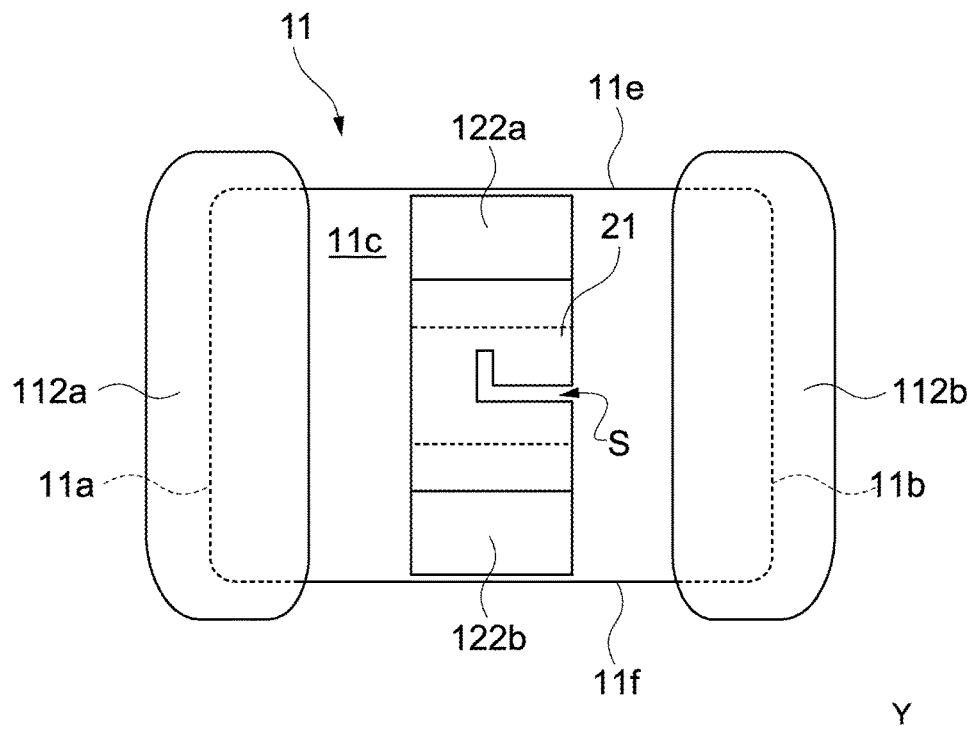
FIG. 12 is a plan view showing the production process of the composite electronic component.
Figure 13:
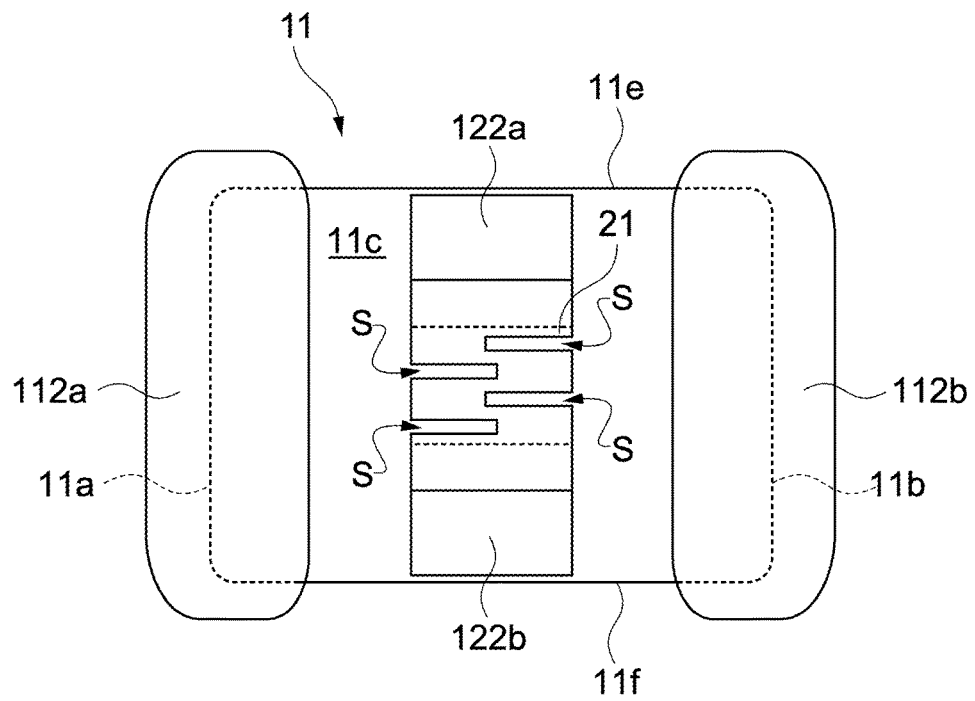
FIG. 13 is a plan view showing the production process of the composite electronic component.

The configuration of the slit S can be determined according to the accuracy of the electric resistance value or the like expected for the resistive element 20. For example, as shown in FIG. 11, a plurality of slits S extending in the X-axis direction may be formed. Further, as shown in FIG. 12, the slit S may be bent in the Y-axis direction. Furthermore, as shown in FIG. 13, a plurality of slits S may alternately extend from one and the other ends in the X-axis direction. In those configurations, the electric resistance value of the resistive film 21 can be adjusted with higher accuracy.

Figure 14:
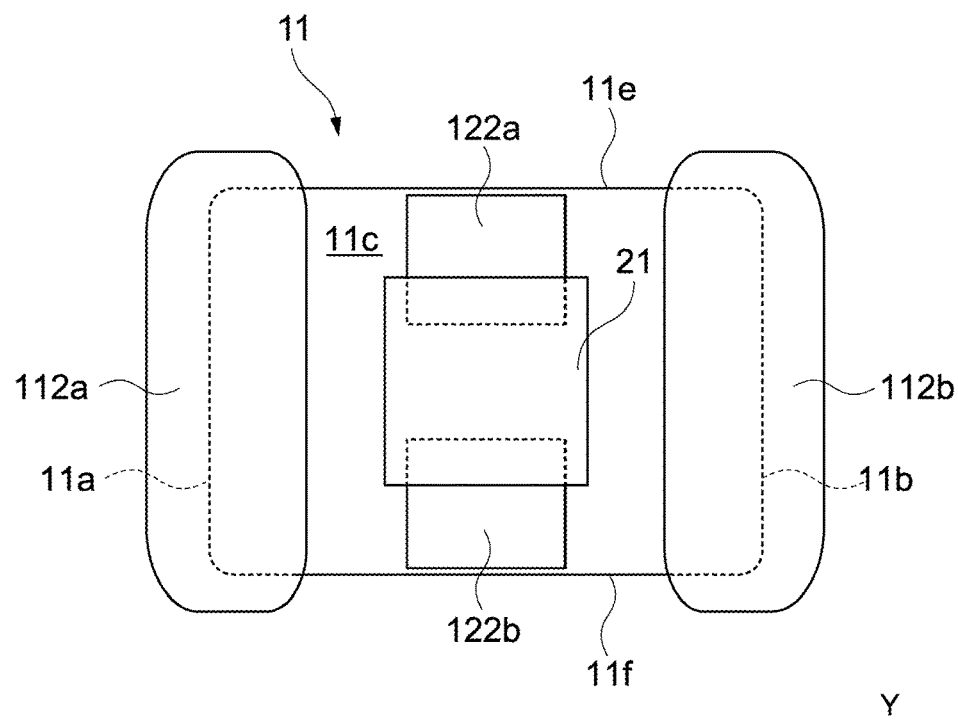
FIG. 14 is a plan view showing the production process of the composite electronic component.

It should be noted that as shown in FIG. 14, in Step S04, the dimension of the resistive film 21 in the X-axis direction may be adjusted to be somewhat large, and here in Step S06, at least part of both the end portions in the X-axis direction may be removed. This allows the dimension of the resistive film 21 and the initial value of the electric resistance value of the resistive element 20 to be adjusted with reliability and high accuracy.

2.7 Step S07: Application of Insulating Paste

Figure 15:
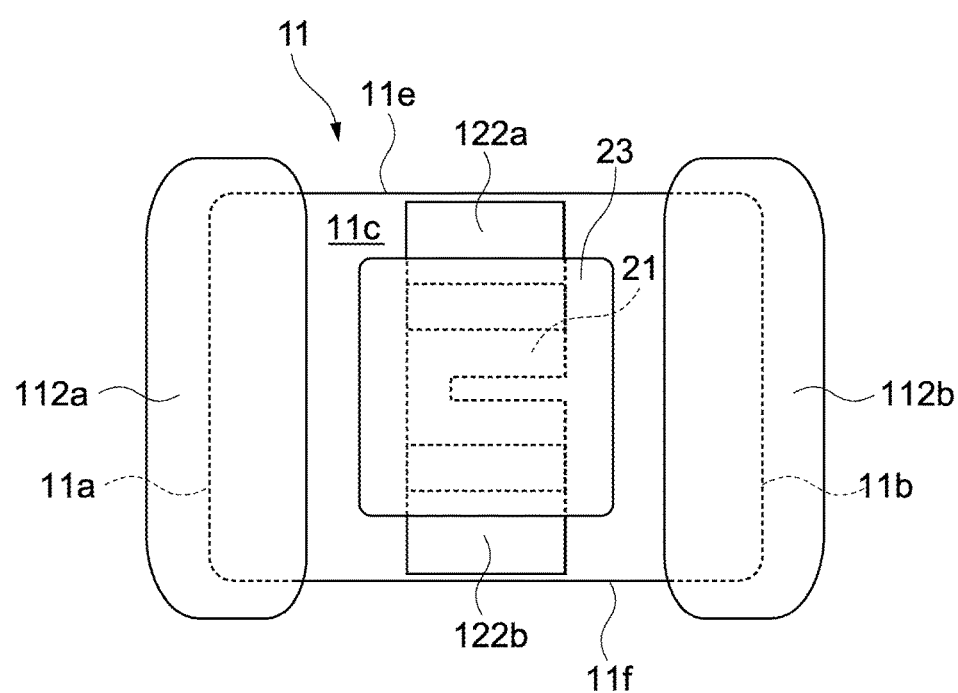
FIG. 15 is a plan view showing the production process of the composite electronic component.

In Step S07, an insulating paste is applied so as to cover the resistive film 21 trimmed in Step S06. Thus, as shown in FIG. 15, an unsintered insulating film 23 is formed. The insulating paste is disposed such that at least part of the base films 122a and 122b of the first and second electrode films 22a and 22b are exposed.

The insulating paste is formed as a paste of the insulating material forming the insulating film 23. In Step S07, for example, a glass pate or the like can be used for the insulating paste. For the application of the insulating paste, for example, various printing methods such as screen printing and gravure printing can be used.

2.8 Step S08: Sintering 3

In Step S08, the unsintered insulating film 23 formed on the ceramic body 11 in Step S07 is sintered. The insulating paste has a lower sintering temperature than the resistive paste. In Step S08, for example, the sintering temperature can be set to 650° C. It should be noted that the sintering time can be determined as appropriate.

The sintering temperature in Step S08 is further made lower than the sintering temperature in Step S05, so that the base films 112a and 112b, the base films 122a and 122b, and the resistive film 21 can be inhibited from being degraded in Step S08. Further, in order to inhibit oxidation of the base films 112a and 112b and the base films 122a and 122b, it is desirable to perform Step S08 under a reduction atmosphere or a low-oxygen partial pressure atmosphere at the oxygen partial pressure of 10 ppm or less.

2.9 Step S09: Plating

Figure 16:
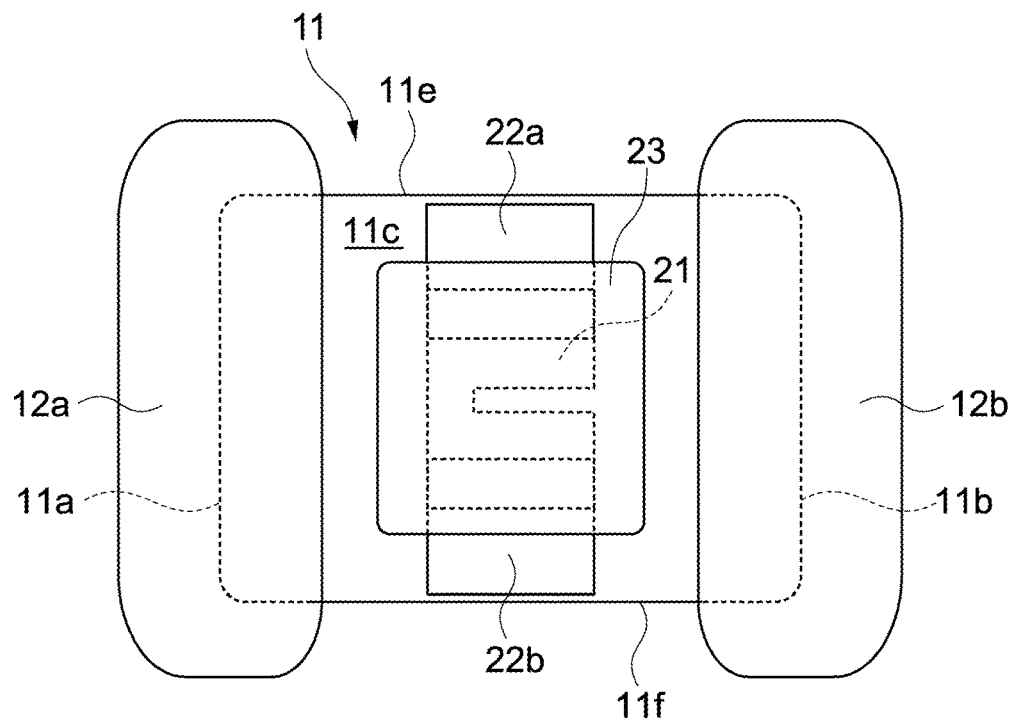
FIG. 16 is a plan view showing the production process of the composite electronic component.

In Step S09, the base films 112a and 112b and the base films 122a and 122b, which are obtained after Step S08, are subjected to plating, thus forming surface films of the first and second external electrodes 12a and 12b and surface films of the first and second electrode films 22a and 22b. Thus, as shown in FIG. 16, the first and second external electrodes 12a and 12b and the first and second electrode films 22a and 22b are obtained.

The surface films of the first and second external electrodes 12a and 12b and the surface films of the first and second electrode films 22a and 22b can mainly contain copper (Cu), tin (Sn), palladium (Pd), gold (Au), zinc (Zn), or the like. Further, the surface films can be formed by using wet plating such as electroplating or dry plating such as sputtering.

2.10 Actions and Effects

As described above, in the production method according to this embodiment, all of the first and second electrode films 22a and 22b, the resistive film 21, and the insulating film 23 of the resistive element 20 are formed by the application of the pastes. Thus, it is unnecessary to mount the resistive element 20 onto the first main surface 11c of the ceramic body 11. This can simplify the production process of the composite electronic component 1.

Further, in the production method according to this embodiment, the resistive element 20 is directly provided onto the first main surface 11c of the ceramic body 11. In other words, the ceramic body 11 doubles as a substrate for the resistive element 20, and thus it is unnecessary to prepare the substrate for the resistive element 20. As a result, the production cost of the composite electronic component 1 is reduced.

2.11 Modified Examples

The method of producing the composite electronic component 1 is not limited to the above and can be changed as needed. For example, in Step S01, the ceramic body 11 including the base films 112a and 112b of the first and second external electrodes 12a and 12b in advance may be prepared. Further, the first electrode film 22a and the second electrode film 22b may be formed after the resistive film 21 is formed.

3. Circuit Board C

Figure 17:
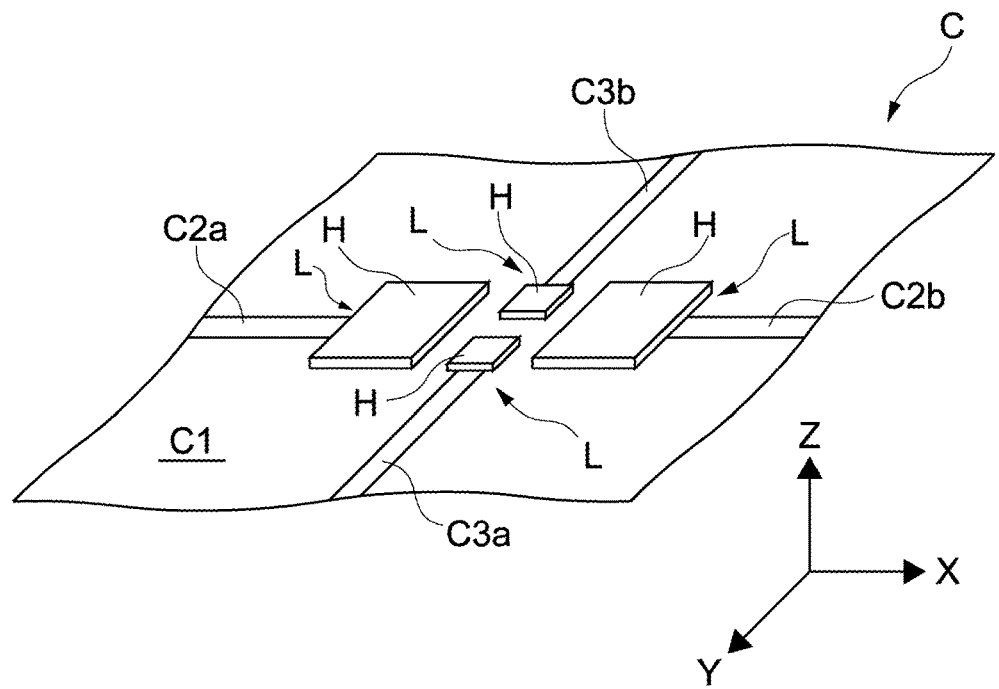
FIG. 17 is a partial perspective view of a circuit board capable of mounting the composite electronic component.

FIG. 17 is a partial perspective view schematically showing an example of the circuit board C capable of mounting the composite electronic component 1. The circuit board C is a substrate including various circuit modules, on which the circuits are formed on at least one of the main surfaces. FIG. 17 shows a mount surface C1 that is configured to be capable of mounting the composite electronic component 1.

On the mount surface C1 of the circuit board C, wiring lines C2a and C2b and wiring lines C3a and C3b are formed. The first external electrode 12a and the second external electrode 12b of the multi-layer ceramic capacitor 10 are respectively connected to the wiring line C2a and the wiring line C2b. The first electrode film 22a and the second electrode film 22b of the resistive element 20 are respectively connected to the wiring line C3a and the wiring line C3b. A land L is provided at each end portion of the wiring lines C2a, C2b, C3a, and C3b. Solder H is disposed on each land L.

Figure 18:
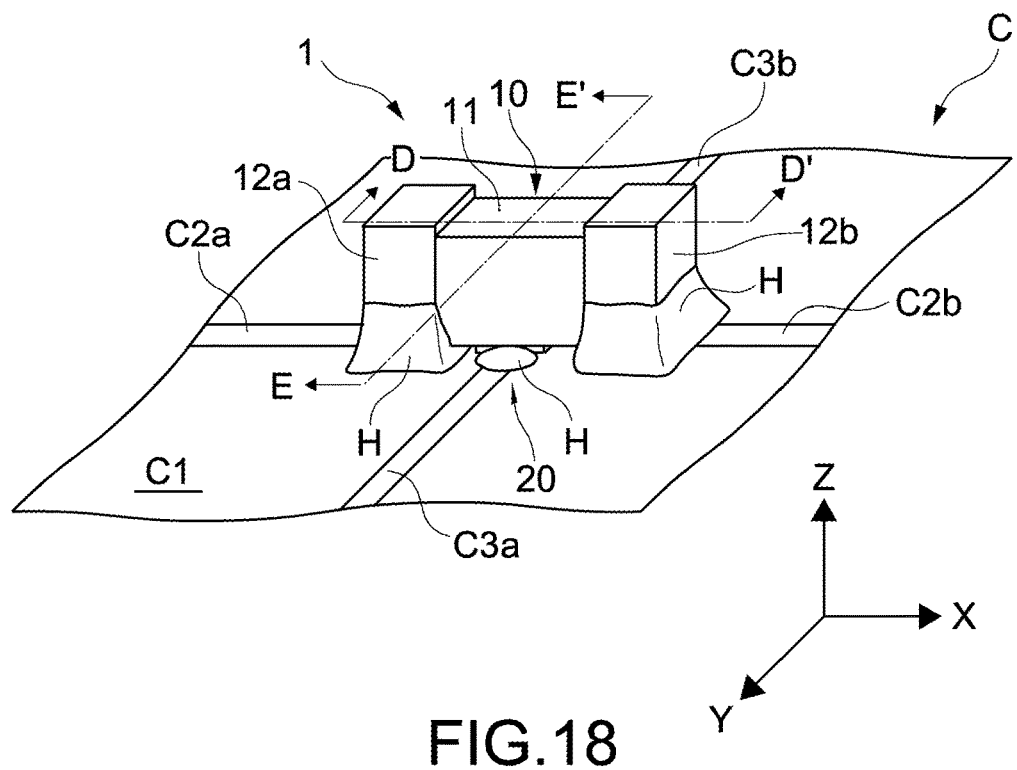
FIG. 18 is a partial perspective view of the circuit board on which the composite electronic component is mounted.

FIG. 18 is a perspective view schematically showing an example of the circuit board C on which the composite electronic component 1 is mounted. When the composite electronic component 1 is mounted on the mount surface C1 of the circuit board C shown in FIG. 18, first, the composite electronic component 1 is disposed on the mount surface C1 of the circuit board C with the first main surface 11c of the ceramic body 11 facing the mount surface C1.

At that time, not only the first and second external electrodes 12a and 12b of the multi-layer ceramic capacitor 10 but also the first and second electrode films 22a and 22b of the resistive element 20 face the respective lands L provided to the mount surface C1 of the circuit board C. In such a manner, in the composite electronic component 1, the first and second electrode films 22a and 22b of the resistive element 20 can be connected to the circuit board C without providing an additional configuration.

Further, since the resistive element 20 is configured to fit within the thickness of each of the first and second external electrodes 12a and 12b of the multi-layer ceramic capacitor 10 from the first main surface 11c, the composite electronic component 1 is held with a stable posture on the circuit board C by the first and second external electrodes 12a and 12b. In other words, the resistive element 20 does not hinder the composite electronic component 1 from being mounted to the circuit board C.

The circuit board C is heated in, for example, a reflow furnace with the composite electronic component 1 being disposed on the mount surface C1 of the circuit board C, so that the solder H on each land L is melted. At that time, the solder H wet-spreads on each of the lands L of the circuit board C and also wet-spreads on the first and second external electrodes 12a and 12b and the first and second electrode films 22a and 22b of the composite electronic component 1.

Subsequently, when the circuit board C is cooled to solidify the solder H, the lands L of the circuit board C are connected to the first and second external electrodes 12a and 12b and the first and second electrode films 22a and 22b of the composite electronic component 1 via the solder H. Thus, the circuit board C on which the composite electronic component 1 shown in FIG. 18 is mounted is obtained.

In such a manner, in the composite electronic component 1, the multi-layer ceramic capacitor 10 and the resistive element 20 can be collectively mounted on the circuit board C. Thus, the mount process can be simplified. As a result, using the composite electronic component 1 can save the production cost of the circuit board C including the multi-layer ceramic capacitor 10 and the resistive element 20.

Further, in the composite electronic component 1, the resistive element 20 fits within a region between the ceramic body 11 of the multi-layer ceramic capacitor 10 and the mount surface C1 of the circuit board C. Thus, it is unnecessary to separately prepare a mount space for the resistive element 20. Therefore, in the composite electronic component 1, the mount space can be saved.

Furthermore, in the composite electronic component 1, the resistive element 20 fits within a region between the ceramic body 11 of the multi-layer ceramic capacitor 10 and the mount surface C1 of the circuit board C. Thus, an external shock or the like is less likely to be applied to the resistive element 20. Therefore, in the composite electronic component 1, the resistive element 20 can be inhibited from being damaged.

Figure 19:
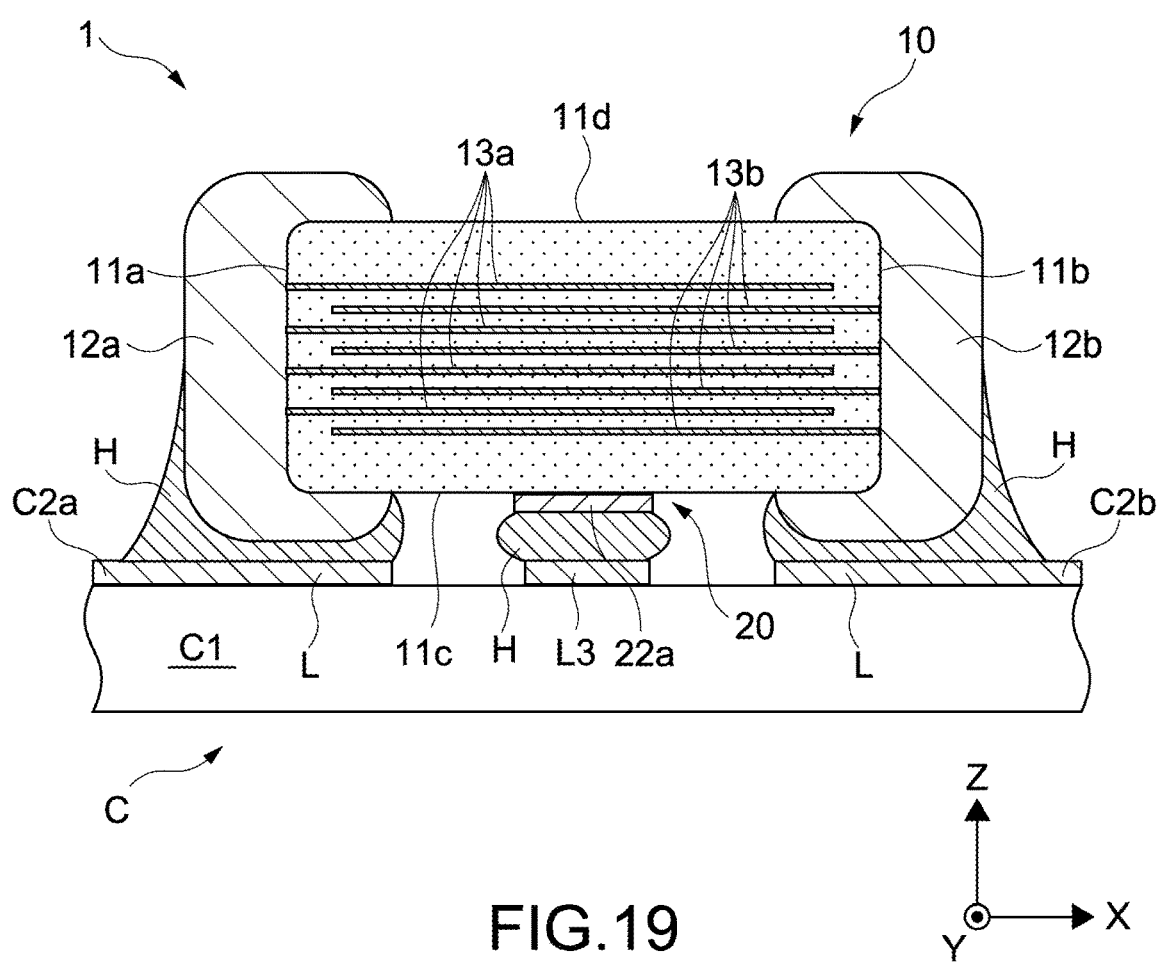
FIG. 19 is a cross-sectional view of the composite electronic component taken along the D-D' line in FIG. 18, the composite electronic component being mounted on the circuit board.
Figure 20:
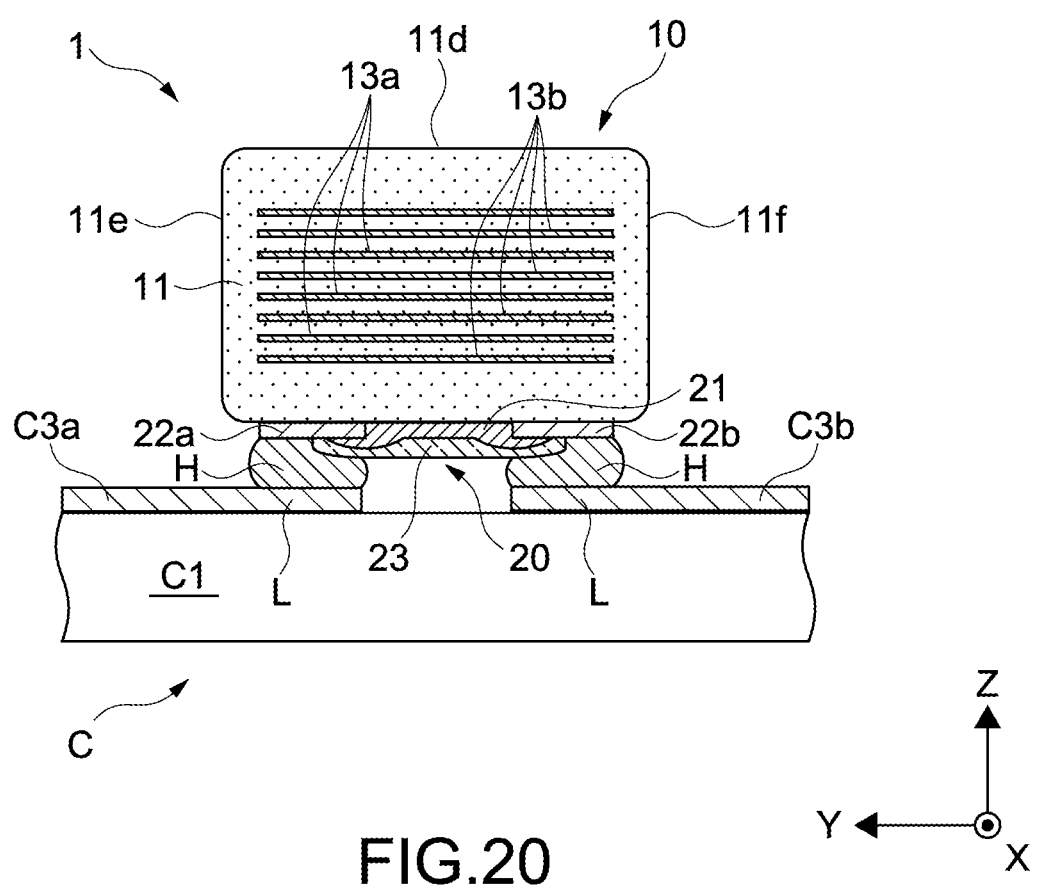
FIG. 20 is a cross-sectional view of the composite electronic component taken along the E-E' line in FIG. 18, the composite electronic component being mounted on the circuit board.

FIG. 19 is a cross-sectional view of the circuit board C taken along the D-D' line in FIG. 18, the composite electronic component 1 being mounted on the circuit board C. FIG. 20 is a cross-sectional view of the circuit board C taken along the E-E' line in FIG. 18, the composite electronic component 1 being mounted on the circuit board C. FIGS. 19 and 20 each show a state of the solder H that connects the composite electronic component 1 and the circuit board C.

In the first external electrode 12a and the second external electrode 12b of the multi-layer ceramic capacitor 10, the solder H wets upward in the Z-axis direction, so that fillets of the solder H are formed. With this configuration, the composite electronic component 1 is successfully held on the mount surface C1 of the circuit board C and is difficult to detach from the mount surface C1 of the circuit board C.

Meanwhile, in the first electrode film 22a and the second electrode film 22b of the resistive element 20, the solder H does not wet up in the Z-axis direction, and fillets are not formed. As a result, the solder H, which connects the resistive element 20 to the circuit board C, has a certain degree of flexibility. Thus, since stress caused by the deflection of the circuit board C is absorbed, the composite electronic component 1 is difficult to damage.

Figure 21A:
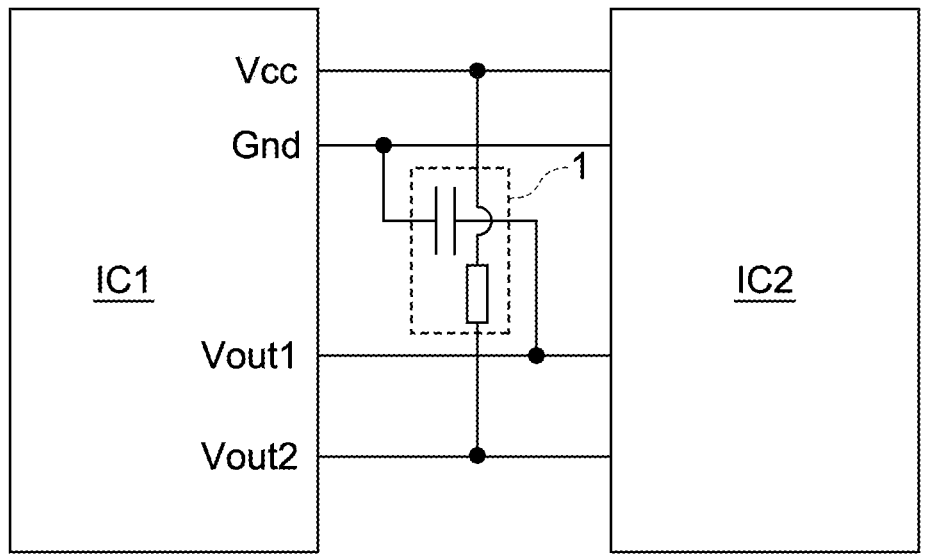
FIGS. 21A and 21B are diagrams each showing a connection example of the composite electronic component.
Figure 21B:
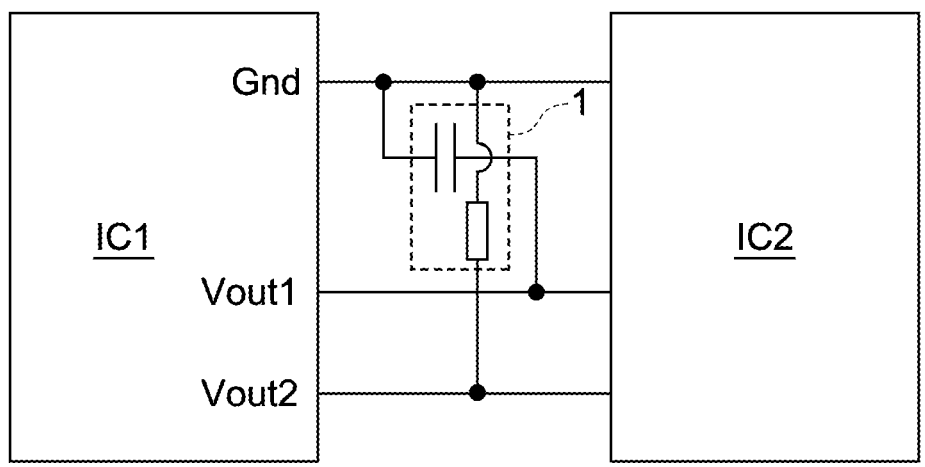

FIGS. 21A and 21B are diagrams each showing a connection example of the composite electronic component 1 on the circuit board C on which two integrated circuits (IC1 and IC2) are provided. In each of the circuit boards shown in FIGS. 21A and 21B, the multi-layer ceramic capacitor 10 and the resistive element 20 of the composite electronic component 1 are connected to wiring for connecting the IC1 and the IC2.

In the example shown in FIG. 21A, the IC1 and the IC2 are connected to each other by four wiring lines Vcc, Gnd, Vout1, and Vout2. The multi-layer ceramic capacitor 10 of the composite electronic component 1 is connected between the wiring line Gnd and the wiring line Vout1, and the resistive element 20 of the composite electronic component 1 is connected between the wiring line Vcc and the wiring line Vout2.

In the example shown in FIG. 21B, the IC1 and the IC2 are connected to each other by three wiring lines Gnd, Vout1, and Vout2. The multi-layer ceramic capacitor 10 of the composite electronic component 1 is connected between the wiring line Gnd and the wiring line Vout1, and the resistive element 20 of the composite electronic component 1 is connected between the wiring line Gnd and the wiring line Vout2.

In the configuration shown in FIG. 21A, the multi-layer ceramic capacitor 10 and the resistive element 20 of the composite electronic component 1 are not electrically connected to each other. Meanwhile, in the configuration shown in FIG. 21B, the multi-layer ceramic capacitor 10 and the resistive element 20 of the composite electronic component 1 are electrically connected to each other via the wiring line Gnd.

4. Composite Electronic Component Package 200

Figure 22:
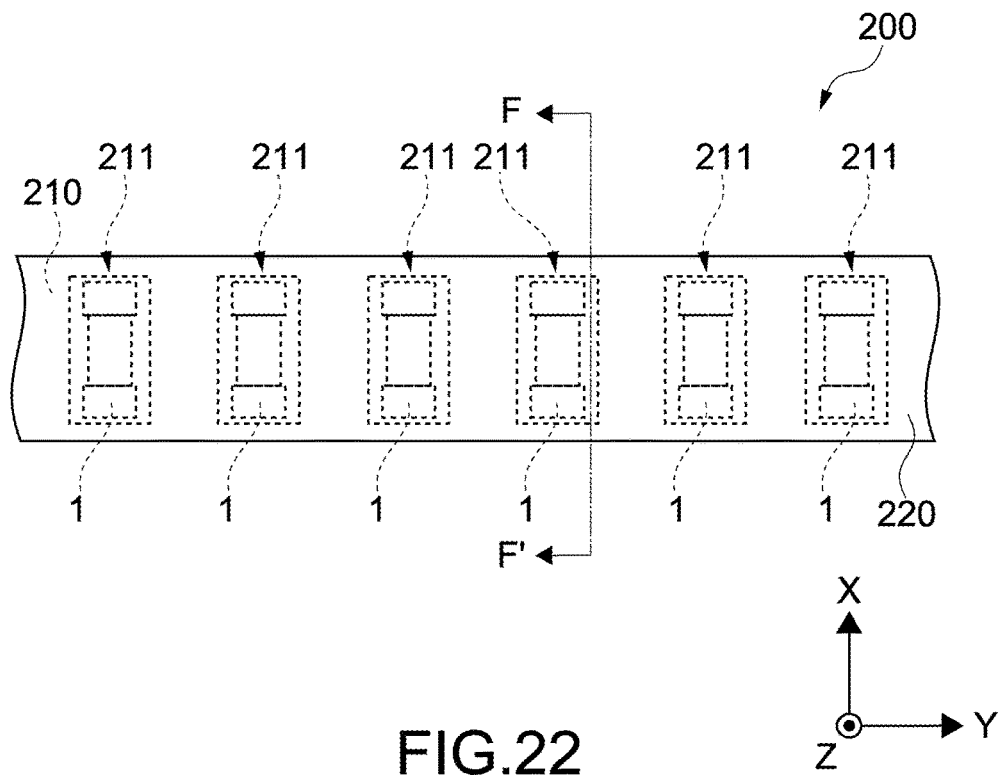
FIG. 22 is a plan view of a composite electronic component package according to an embodiment of the present invention.
Figure 23:
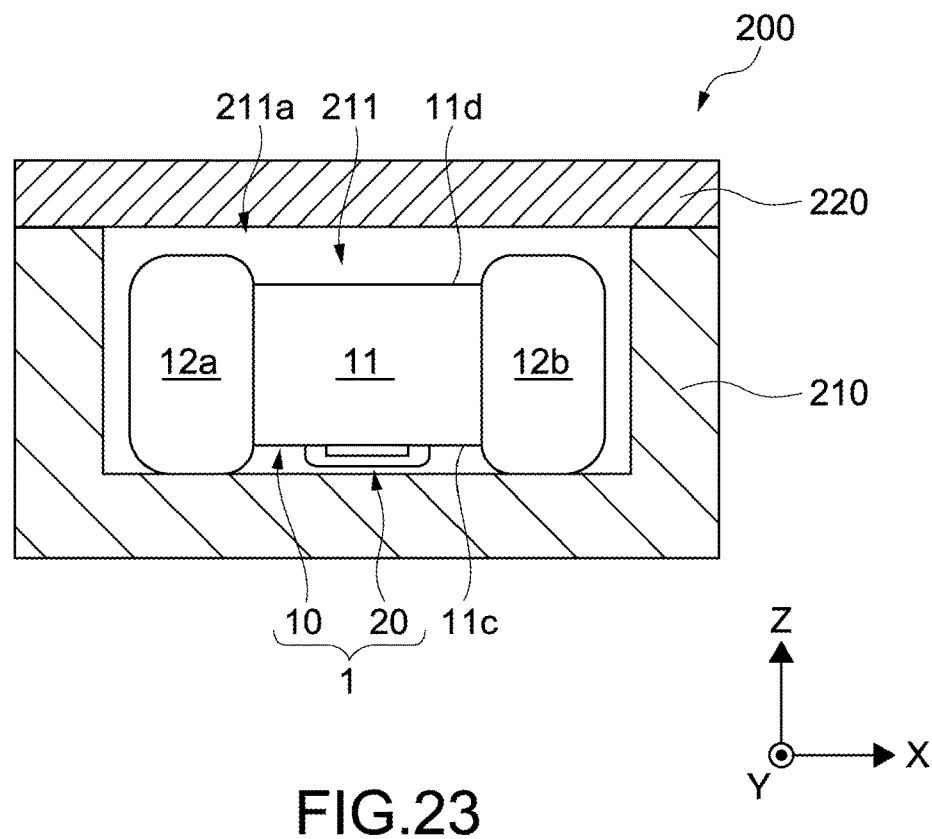
FIG. 23 is a cross-sectional view of the composite electronic component package taken along the F-F' line in FIG. 22.

FIG. 22 is a plan view of a composite electronic component package 200 in which the composite electronic components 1 according to this embodiment are packaged. FIG. 23 is a cross-sectional view of the composite electronic component package 200 taken along the F-F' line in FIG. 22. The composite electronic component package 200 includes the composite electronic components 1, a housing portion 210, and a sealing portion 220.

The housing portion 210 is configured as a carrier tape extending in the Y-axis direction. The housing portion 210 includes a plurality of recesses 211 that are arranged along the Y-axis direction with intervals therebetween. Each of the recesses 211 houses one composite electronic component 1. Each of the recesses 211 includes a take-out opening 211a that is opened upward in the Z-axis direction.

The sealing portion 220 is configured as a cover tape that covers the housing portion 210 from above in the Z-axis direction. In other words, the sealing portion 220 closes the take-out openings 211a of the recesses 211 of the housing portion 210 and seals the recesses 211 of the housing portion 210. The sealing portion 220 is detachably attached to the housing portion 210.

The composite electronic component 1 is disposed in the recess 211 of the housing portion 210 with the first main surface 11c of the ceramic body 11 facing downward in the Z-axis direction and with the second main surface 11d of the ceramic body 11 facing upward in the Z-axis direction. In other words, the second main surface 11d of the ceramic body 11 faces toward the take-out opening 211a.

When the composite electronic components 1 are mounted, the recesses 211 of the housing portion 210 are sequentially opened while the sealing portion 220 is peeled off from the housing portion 210 along the Y-axis direction. Each composite electronic component 1 in the opened recess 211 is then taken out through the take-out opening 211a with the second main surface 11d of the ceramic body 11 being held with suction by a chip mounter.

The chip mounter moves the composite electronic component 1 held with suction to a predetermined position on the mount surface C of the circuit board C. At that time, the first main surface 11c of the ceramic body 11 faces the mount surface C1. The suction of the second main surface 11d by the chip mounter is then released, so that the composite electronic component 1 is disposed on the mount surface C1 of the circuit board C.

In such a manner, use of the composite electronic component package 200 allows the composite electronic component 1 to be mounted without mistaking the lower orientation of the ceramic body 11 in the Z-axis direction for the upper orientation thereof. Further, since it is unnecessary to change the orientation of the composite electronic component 1 within the recess 211 of the housing portion 210 at the time of mounting, the composite electronic component 1 can be easily mounted.

It should be noted that the housing portion 210 only needs to include the arranged recesses 211 capable of housing the composite electronic components 1, and the housing portion 210 is not limited to the carrier tape. For example, the housing portion 210 may be a chip tray in which the recesses 211 are arranged in a lattice form, for example. Further, the sealing portion 220 only needs to be capable of sealing the recesses 211 and is not limited to the cover tape.

Further, a material forming the housing portion 210 and the sealing portion 220 is not limited to a specific type. For the material forming the housing portion 210 and the sealing portion 220, for example, a synthetic resin, paper, or the like can be used. Further, the housing portion 210 and the sealing portion 220 may be formed of a similar-type material or may be formed of different materials.

5. Other Embodiments

While the embodiment of the present invention has been described, the present invention is not limited to the embodiment described above, and it should be appreciated that the present invention may be variously modified without departing from the gist of the present invention as a matter of course.

For example, the first electronic component of the composite electronic component only needs to include a pair of external electrodes and is not limited to a multi-layer ceramic capacitor. The first electronic component may be, for example, a multi-layer ceramic electronic component other than a capacitor, such as an inductor, a varistor, or a thermistor. Furthermore, the first electronic component may be an electronic component that does not have a laminate structure, such as a resistive element.

Further, the second electronic component of the composite electronic component only needs to include a functional film and a pair of electrode films and is not limited to a resistive element. The second electronic component may be, for example, an inductor including a functional film formed in a meander wiring pattern, or may be a capacitor including a functional film formed of ferroelectrics.

What is claimed is:
1. A composite electronic component, comprising:
a first electronic component including
a ceramic body having
a first main surface and a second main surface that face each other, the first main surface being configured to face a circuit board at a time of mounting,
a first end surface and a second end surface that are orthogonal to the first main surface and the second main surface,
a first side surface and a second side surface that are orthogonal to the first main surface, the second main surface, the first end surface, and the second end surface, and
a first external electrode and a second external electrode that are respectively provided to the first end surface and the second end surface and respectively extend from the first end surface and the second end surface to the first main surface; and
a second electronic component including
a functional film that is provided to the first main surface, and
a first electrode film and a second electrode film that are provided to both end portions of the functional film and that are provided physically spaced apart from the first external electrode and the second external electrode, the second electronic component being configured to fit within a thickness of each of the first external electrode and the second external electrode from the first main surface,
wherein the first electrode film and the second electrode film are provided to the first main surface and are omitted from the first side surface, the second side surface, and the second main surface.
2. The composite electronic component according to claim 1, wherein
the first electrode film and the second electrode film face each other in a direction parallel to the first end surface and the second end surface.
3. The composite electronic component according to claim 1, wherein the first electronic component includes a multi-layer ceramic electronic component.

4. The composite electronic component according to claim 3, wherein
the multi-layer ceramic electronic component includes a multi-layer ceramic capacitor.

5. The composite electronic component according to claim 1, wherein
the second electronic component includes a resistive element.

6. The composite electronic component according to claim 1, wherein
the second electronic component further includes an insulating film that covers the functional film.

7. A composite electronic component package, comprising:
a composite electronic component including
a first electronic component including
a ceramic body having
a first main surface and a second main surface that face each other,
a first end surface and a second end surface that are orthogonal to the first main surface and the second main surface,
a first side surface and a second side surface that are orthogonal to the first main surface, the second main surface, the first end surface, and the second end surface, and
a first external electrode and a second external electrode that are respectively provided to the first end surface and the second end surface and respectively extend from the first end surface and the second end surface to the first main surface, and a second electronic component including
a functional film that is provided to the first main surface, and
a first electrode film and a second electrode film that are provided to both end portions of the functional film and that are provided physically spaced apart from the first external electrode and the second external electrode, the second electronic component being configured to fit within a thickness of each of the first external electrode and the second external electrode from the first main surface;
a housing portion that includes a plurality of recesses, each of the plurality of recesses including a take-out opening and housing the composite electronic component with the second main surface facing toward the take-out opening; and
a sealing portion that covers the take-out opening of each of the plurality of recesses,
wherein the first electrode film and the second electrode film are provided to the first main surface and are omitted from the first side surface, the second side surface, and the second main surface.

8. A circuit board, comprising:
a mount surface;
a pair of first wiring lines and a pair of second wiring lines that are provided on the mount surface; and
a composite electronic component that is mounted on the mount surface, the composite electronic component including
a first electronic component including
a ceramic body having
a first main surface and a second main surface that face each other, the first main surface facing the mount surface,
a first end surface and a second end surface that are orthogonal to the first main surface and the second main surface,
a first side surface and a second side surface that are orthogonal to the first main surface, the second main surface, the first end surface, and the second end surface, and
a first external electrode and a second external electrode that are respectively provided to the first end surface and the second end surface and respectively extend from the first end surface and the second end surface to the first main surface, and a second electronic component including
a functional film that is provided to the first main surface, and
a first electrode film and a second electrode film that are provided to both end portions of the functional film and that are provided physically spaced apart from the first external electrode and the second external electrode, the second electronic component being configured to fit within a thickness of each of the first external electrode and the second external electrode from the first main surface,
wherein the first electrode film and the second electrode film are provided to the first main surface and are omitted from the first side surface, the second side surface, and the second main surface.

* * * * *